(12) United States Patent
Rosch et al.

(10) Patent No.: US 11,769,719 B2
(45) Date of Patent: Sep. 26, 2023

(54) DUAL TRACE THICKNESS FOR SINGLE LAYER ROUTING

(71) Applicant: Intel Corporation, Santa Clara, CA (US)

(72) Inventors: Jonathan Rosch, Mesa, AZ (US); Wei-Lun Jen, Chandler, AZ (US); Cheng Xu, Chandler, AZ (US); Liwei Cheng, Chandler, AZ (US); Andrew Brown, Chandler, AZ (US); Yikang Deng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1089 days.

(21) Appl. No.: 16/017,671

(22) Filed: Jun. 25, 2018

(65) Prior Publication Data

US 2019/0393143 A1   Dec. 26, 2019

(51) Int. Cl.
| | |
|---|---|
| H05K 1/11 | (2006.01) |
| H05K 1/18 | (2006.01) |
| H01L 23/498 | (2006.01) |
| H01L 21/48 | (2006.01) |
| H05K 1/02 | (2006.01) |

(52) U.S. Cl.
CPC ...... H01L 23/49838 (2013.01); H01L 21/486 (2013.01); H01L 21/4857 (2013.01); H01L 23/49822 (2013.01); H01L 23/49827 (2013.01); H05K 1/111 (2013.01); H05K 1/115 (2013.01); *H05K 1/025* (2013.01); *H05K 1/18* (2013.01); *H05K 2201/095* (2013.01); *H05K 2201/09727* (2013.01); *H05K 2201/09736* (2013.01); *H05K 2201/09827* (2013.01)

(58) Field of Classification Search
CPC .... H01L 24/50; H05K 1/0277; H05K 1/0278; H05K 1/028; H05K 1/0281; H05K 1/0283; H05K 1/0393; H05K 1/118; H05K 1/147; H05K 1/148; H05K 1/189; H05K 2201/042; H05K 2201/046; H05K 2201/05
See application file for complete search history.

(56) References Cited

U.S. PATENT DOCUMENTS

| | | | | |
|---|---|---|---|---|
| 4,804,615 | A * | 2/1989 | Larson .................. | H05K 3/243 205/126 |
| 6,667,190 | B2 * | 12/2003 | Kung .................... | H05K 3/243 257/E23.068 |

(Continued)

*Primary Examiner* — Ishwarbhai B Patel
(74) *Attorney, Agent, or Firm* — Schwabe, Williamson & Wyatt, P.C.

(57) ABSTRACT

Embodiments include a package substrate, a method of forming the package substrate, and a semiconductor package. A package substrate includes a conductive layer in a dielectric, a first trace and a first via pad of the conductive layer having a first thickness, and a second trace and a second via pad of the conductive layer having a second thickness. The second thickness of second trace and second via pad may be greater than the first thickness of the first trace and first via pad. The dielectric may include a first dielectric thickness and a second dielectric thickness, where the second dielectric thickness may be less than the first dielectric thickness. The package substrate may include a third via having a third thickness on the first via pad, and a fourth via having a fourth thickness on the second via pad, wherein the third thickness is greater than the fourth thickness.

8 Claims, 14 Drawing Sheets

(56) References Cited

U.S. PATENT DOCUMENTS

| | | | | |
|---|---|---|---|---|
| 7,834,277 | B2* | 11/2010 | Ohsumi | H05K 3/427 |
| | | | | 174/266 |
| 9,497,864 | B2* | 11/2016 | Kung | H01L 21/563 |
| 10,181,431 | B2* | 1/2019 | Lee | H05K 3/108 |
| 2010/0071950 | A1* | 3/2010 | Ohsumi | H05K 3/243 |
| | | | | 427/97.3 |
| 2012/0234589 | A1* | 9/2012 | Furuichi | H01L 23/49822 |
| | | | | 29/837 |
| 2017/0127517 | A1* | 5/2017 | Ishihara | H05K 1/056 |

* cited by examiner

DUAL TRACE THICKNESS FOR SINGLE LAYER ROUTING

FIELD

Embodiments relate to packaging semiconductor devices. More particularly, the embodiments relate to semiconductor devices that include a routing layer having traces with two different thicknesses and methods for forming such devices.

BACKGROUND

Packaging of semiconductor devices present several problems. One of the main problems with packaging semiconductor devices includes the direct conflict between the desired manufacturing properties that are needed for single-ended routing structures and differential routing structures. This problem causes issues with impedance tolerances for high speed input/output (TO) applications within one or more routing layers.

Single-ended routing structures have high sensitivity to noise and crosstalk, as such these structures typically favor thinner copper (Cu) features and thicker electrical insulation. The high sensitivity of these single-ended routing structures translates into thin Cu features, narrow trace widths, wide trace spacings, and thick dielectric portions above and below the traces. Alternatively, differential routing structures have less sensitivity to noise and crosstalk as such these structures typically favor thicker Cu features and are complemented with thinner electrical insulation. The low sensitivity of these differential routing structures translates into thick Cu features, wide trace widths, narrow trace spacings, and thin dielectric portions above and below the traces.

Accordingly, between single-ended and differential routing structures, there is a direct conflict to achieve the desired properties of each routing structure if they are routed within the same build-up layer. To mitigate this problem, some packaging solutions provide either a compromise between the desired Cu thickness and the dielectric thickness which leads to reduced electrical performances, or the routing structures have to be routed/formed on different build-up layers of the substrate to enable each structure to work independently of the other structure which leads to increased manufacturing costs, time, and risks. For the latter packaging solution, a lithography via (LIV) process is generally implemented to form the thick and thin routing structures on different build-up layers. The LIV process, however, is intrinsically limited due to the planarization process which creates manufacturing risks for the thicker routing structures. The LIV process also requires a second patterning step to overlap with a first patterning step to form interconnect/routing layers, which creates limitations for routing and designing of interconnect layers. In addition, the planarization process associated with the LIV process also limits the resolution of the routing and via structures as a result of the photoresist thicknesses that are needed to form thicker structures.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages that include routing layers having traces with different thicknesses and methods of forming such semiconductor packages. According to some embodiments, the semiconductor package described below and methods of forming such semiconductor package include a single routing layer having thinner copper (Cu) features with thicker dielectric portions for single-ended routing structures, while simultaneously disposing thicker Cu features with thinner dielectric portions for differential routing structures in the same single routing layer. These semiconductor packages enable (i) impedance tolerance improvements for high-speed input/output (TO) (HSIO) applications, and (ii) two different routing structures with two different desired features (e.g., varying Cu thicknesses and dielectric thicknesses) into a single routing layer, which helps to reduce the existing restrictions/limitations, the process flow steps, and the overall cost and time.

Figure 1A:
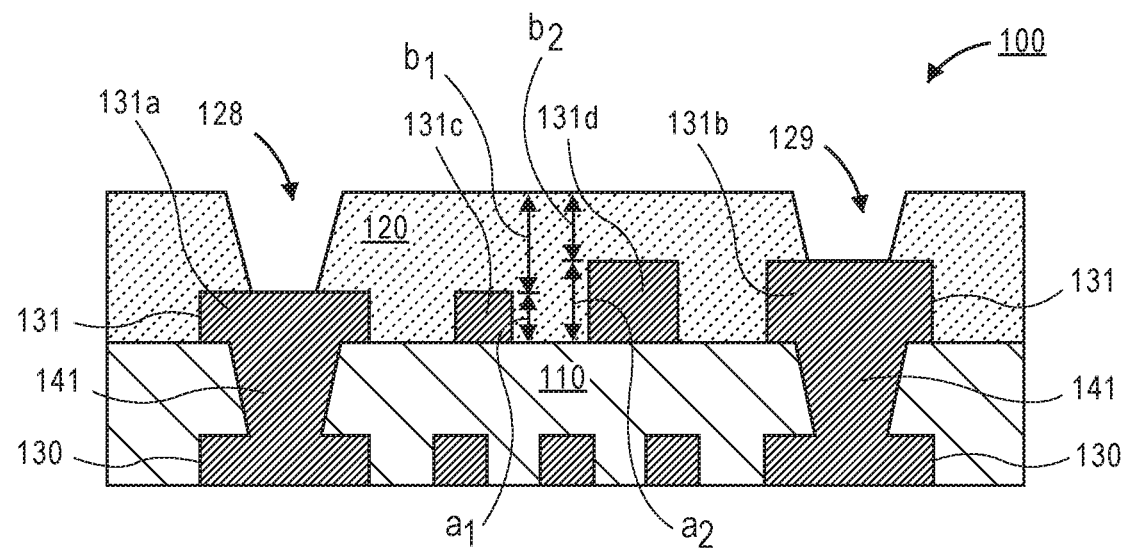
FIG. 1A is an illustration of a cross-sectional view of a package substrate having vias, traces, conductive layers, and dielectric layers, where a dielectric layer includes traces and dielectric portions with different thicknesses, according to one embodiment.
Figure 1B:
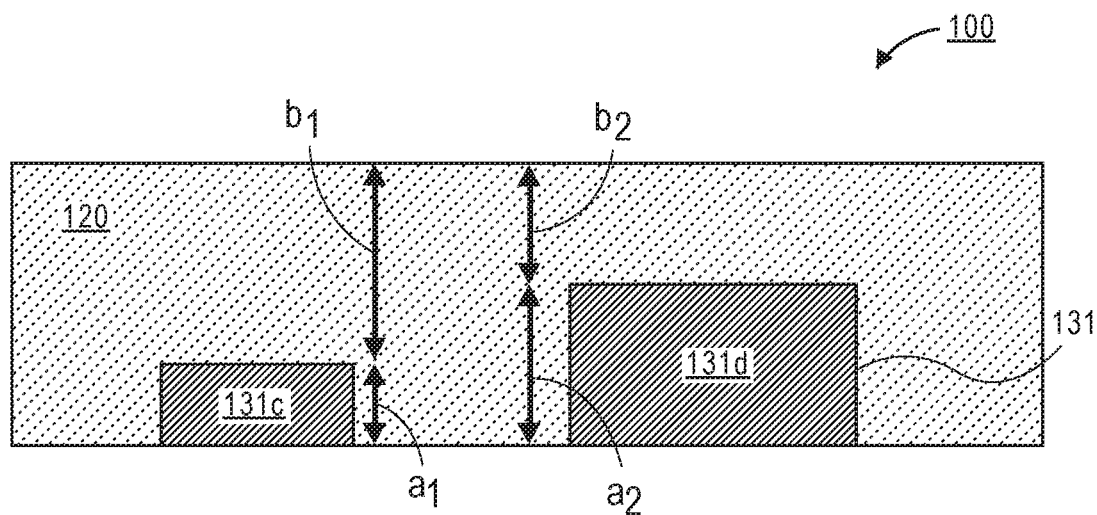
FIG. 1B is an illustration of an enlarged cross-sectional view of the dielectric layer including the traces and the dielectric portions with different thicknesses, according to one embodiment.

According to some embodiments, a package substrate is described (e.g., the package substrate 100 shown in FIG. 1). For one embodiment, the package substrate includes a conductive layer (e.g., the conductive layer 131 of FIG. 1)

disposed in a dielectric layer (e.g., the dielectric layer 120 of FIG. 1). For one embodiment, the conductive layer has a first trace (e.g., trace 131c of FIG. 1) with a first thickness (e.g., shown with $a_1$ of FIG. 1B). For example, the first thickness may be approximately 20 μm or less. Additionally, in one embodiment, the conductive layer has a second trace (e.g., trace 131d of FIG. 1) with a second thickness (e.g., shown with $a_2$ of FIG. 1B). For example, the second thickness may be approximately 35 μm or less. In some embodiments, the second thickness of the second trace is greater than the first thickness of the first trace. Additionally, the first trace may also have a first width (e.g., a width of approximately 20 μm or less) that is less than a second width (e.g., a width of approximately 35 μm or less) of the second trace. Likewise, in these embodiments, the dielectric layer may be patterned to have a first dielectric thickness (e.g., shown with $b_1$ of FIG. 1B) above the first trace and a second dielectric thickness (e.g., shown with $b_2$ of FIG. 1B) above the second trace, where the second dielectric thickness (e.g., a thickness of approximately 10 μm or less) is less than the first dielectric thickness (e.g., a thickness of approximately 25 μm or less) with the same dielectric layer.

Accordingly, for these embodiments, the package substrate includes a single routing layer having thinner Cu features for the first trace with thicker dielectric portions for single-ended routing traces (or lines), and thicker Cu features for the second trace with thinner dielectric portions for differential routing traces within the same single routing layer. These embodiments of the package substrate enable two individual exposures steps that are used to pattern two sets of Cu features (e.g., traces, via pads, and/or vias) in one routing layer, where each set of Cu features may have a desired Cu thickness that is different than the other set of Cu features. For example, to form these two sets of Cu features with different thicknesses, the routing layers of the package substrate may be formed using two differently patterned photoresist layers with different thickness (e.g., as shown with photoresist 240 of FIG. 2A and photoresist 242 of FIG. 2C) and a laser drilling process for the via formations (e.g., as shown with FIG. 2F), where the laser drilling process is implemented as opposed to a combination of lithography and planarization steps that are generally used to expose a via.

Embodiments of the package substrate enhance packaging solutions by implementing a laser via process that may be used (or embedded) with a lithographical plating and patterning process, as these embodiments may also utilize thinner photoresists to enable finer/thinner litho-defined Cu features (e.g., as compared to the LIV process). By implementing the embodiments described herein, the electrical performances of these package substrates are improved—rather than compromised—by allowing tailored Cu and dielectric thicknesses within a single routing layer based on the desired routing and power delivery requirements. Some other additional advantages of the embodiments described herein include (i) reduced assembly steps that are not limited by a planarization process, (ii) decreased manufacturing risks associated with thicker routing structures, and (iii) optimal resolution of the routing and via structures when using thick photoresists to plate the thick structures.

For some embodiments, the dual trace thicknesses in a single routing layer help to (i) reduce crosstalk in single-ended HSIO signals at higher data rates, (ii) create trace (or transmission line) design flexibility to tailor the impedance of a signal to a desired target, and (iii) provide design flexibility to implement differential signals to a targeted differential impedance. These embodiments described herein further improve the existing packaging technologies by providing: (i) a package substrate with varying trace and dielectric thicknesses within the same routing layer, (ii) the package substrate may facilitate (or support) multiple applications such as controlling crosstalk in HSIO interconnects and/or combining single-ended and differential routing structures within one layer, (iii) the package substrate improves reliability and certainty, (iv) the varying trace and dielectric thicknesses of the package substrate may be formed independent of layer counts or package sizes and thus may be used for a wide variety of products, (v) the method used to form the varying trace and dielectric thicknesses of the package substrate may be repeated multiple times within multiple build-up layers that are independent of each other, and (vi) the package substrate may be implemented with standard materials used in semiconductor packaging.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including package substrates having vias, traces, conductive layers, and dielectric layers, where a single routing layer in a dielectric layer has traces and dielectric portions with different thicknesses.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1A is an illustration of a cross-sectional view of a package substrate 100 having vias 141, traces 131c-d, conductive layers 130-131, and dielectric layers 110 and 120, where the dielectric layer 120 includes traces 131c-d and dielectric portions $b_1$ and $b_2$ with different thicknesses, according to one embodiment. FIG. 1B is an illustration of an enlarged cross-sectional view of the dielectric layer 120 including the traces 131c-d with different trace thicknesses $a_1$-$a_2$ and different dielectric thicknesses $b_1$-$b_2$, according to one embodiment.

Specifically, FIG. 1A illustrates a single routing layer having a conductive layer 131 disposed in a dielectric layer 120, the conductive layer 131 has a first trace 131c with a first thickness $a_1$ and a second trace 131d with a second thickness $a_2$, where the second thickness $a_2$ of the second trace 131d may be greater than the first thickness $a_1$ of the first trace 131c. As illustrated in FIG. 1A, the routing layer also includes the dielectric layer 120 having a first dielectric thickness $b_1$ and a second dielectric thickness $b_2$, where the second dielectric thickness $b_2$ may be less than the first dielectric thickness $b_1$.

As used herein, a "single routing layer" may refer to a single layer of a build-up structures used for routing interconnects/features, where the single routing layer may include a conductive layer disposed in a dielectric layer. The "single routing layer" described herein may refer to a routing layer that combines (i) thinner Cu features (e.g., via pad 131a and trace 131c) with thicker dielectric portions (e.g., the dielectric portion $b_1$ above the via pad 131a, and the dielectric portion $b_1$ above the trace 131c) above the thinner Cu features for single-ended routing structures, and (ii) thicker Cu features (e.g., via pad 131b and trace 131d) with thinner dielectric portions (e.g., the dielectric portion $b_2$ above the via pad 131b, and the dielectric portion $b_2$ above the trace 131d) above the thinner Cu features for differential routing structures within the same routing layer. As used herein, a "dielectric portion" refers to a portion of a dielectric layer, where the portion has a thickness within the dielectric layer, and where the dielectric portion may be defined by the thickness, for example, above a via pad and/or a trace (e.g., as illustrated by the dielectric portions "$b_1$" and "$b_2$" in FIGS. 1A-1B).

Figure 3:
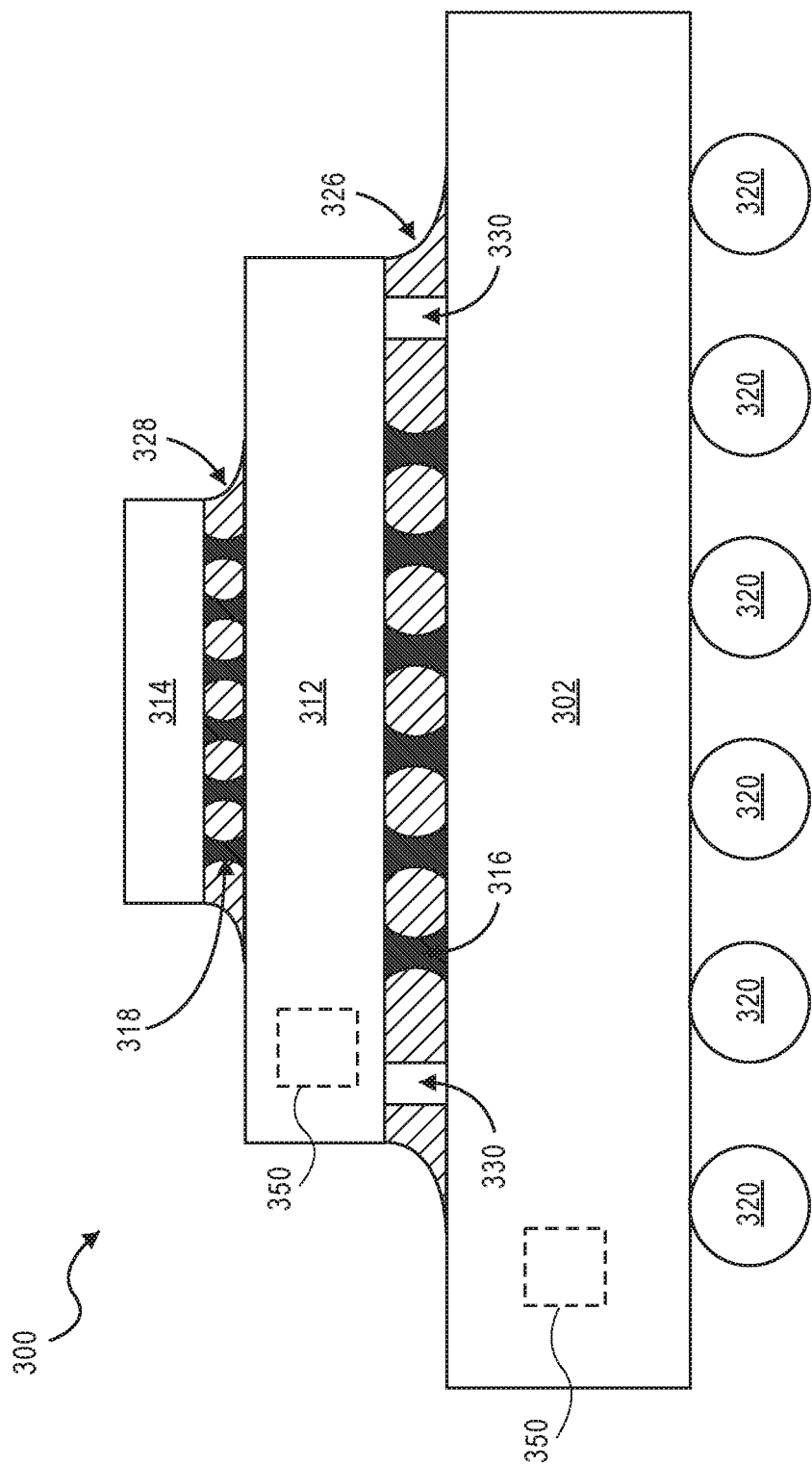
FIG. 3 is an illustration of a cross-sectional view of a semiconductor package including a package substrate having vias, traces, conductive layers, and dielectric layers, where a dielectric layer includes traces and dielectric portions with different thicknesses, according to one embodiment.

For some embodiments, the package substrate 100 may be included in a semiconductor package (e.g., as shown in FIG. 3), where the semiconductor package may include the package substrate (e.g., package substrate 100) and one or more additional substrates, dies, interposers, etc., that are stacked/coupled to form the semiconductor package.

According to some embodiments, the package substrate 102 may include, but is not limited to, a substrate, a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers 110 and 120, where each dielectric layer can be a photosensitive dielectric layer. For some embodiments, holes may be drilled in the PCB 100. For one embodiment, the PCB 100 may also include conductive layers 130-131 (e.g., Cu (or any other metallic/conductive material) used to form traces/vias/via pads/planes, etc.), vias 141, via pads 131a-b, traces 131c-d, and/or holes.

In one embodiment, the package substrate 100 may include a first conductive layer 130 disposed in a first dielectric 110, a second conductive layer 131 disposed on the first dielectric 110, and a second dielectric 120 disposed over and around the second conductive layer 131, where the second dielectric 120 is patterned with via openings 128-129 to expose via pads 131a-b of the second conductive layer 131.

By way of example, the first and second dielectric layers 110 and 120 may be a polymer material such as, for example, polyimide, epoxy, or build-up film (BF). For one embodiment, the first and second dielectric layers 110 and 120 may be an ajinomoto build-up film (ABF). In an embodiment, the first and second dielectric layers 110 and 120 may be one layer in a stack that includes a plurality of additional dielectric layers used to form a build-up structure. As such, by way of example, the first dielectric layer 110 may be formed over another dielectric layer.

Additional embodiments may include disposing (or laminating) the first dielectric layer 1140 as the base dielectric layer over a core material (e.g., a glass carrier or the like) on which the stack is formed. In one embodiment, the first and second conductive layers 130-131 may be formed on a copper seed layer. For one embodiment, the first and second conductive layers 130-131 may include one or more electrical contacts, including, but not limited to, pads, signal traces/lines, vias, via pads, planes, and/or the like. According to an additional embodiment, the first dielectric 110 may be the bottommost layer of the package substrate 100 and may be, but is not limited to, a metallic material, an adhesive layer/film/tape, or any other core material. For one embodiment, the first conductive layer 130 is disposed in the first dielectric 110 and may be coupled with a conductive layer in a lower layer of the package substrate 100.

The package substrate 100 may have the second dielectric layer 120 disposed on the first dielectric layer 110. In one embodiment, the second dielectric layer 120 has a first bottom surface (on the right side of the package substrate 100) and a second bottom surface (on the left side of the package substrate 100). In one embodiment, the first conductive layer 130 and the vias 141 may be disposed (or patterned/formed) in the first dielectric layer 110. For one embodiment, the second conductive layer 131 may be disposed in the second dielectric layer 120. For one embodiment, the vias 141 couple at least one or more electrical contacts of the first conductive layer 130 and at least one or more electrical contacts of the second conductive layer 131. For one embodiment, the traces of the first conductive layer 130 have approximately the same thickness that may be formed using any existing plating process. Meanwhile, as the embodiments described herein, the traces 131c-d of the second conductive layer 131 have two different trace and dielectric thicknesses $a_1$-$a_2$ and $b_1$-$b_2$ that may be formed using a combination of a laser drilling process and two-step photoresist patterning process (as described in further detail below), which allows that respective routing layer to combine single-ended routing structures and differential routing structures.

For example, as shown in FIG. 1B, the package substrate 100 may have a routing layer with a selected thickness (e.g., a thickness of approximately 55 μm or less) as the thicknesses $a_1$–$a_2$ of the Cu traces 131c-d and the thicknesses $b_1$–$b_2$ of the dielectric layer 120 may be balanced based on the desired routing requirements. As such, for some embodiments, the routing layer of the package substrate 100 may have thin Cu features for via pad 131a and trace 131c with thicker dielectric $b_1$ and thick Cu features for via pad 131b and trace 131cd have thinner dielectric $b_2$, where the combined sum of the thin trace and thicker dielectric thicknesses ($a_1+b_1$) and the combined sum of the thicker trace and thin dielectric thicknesses ($a_2+b_2$) may be approximately equivalent (i.e., $a_1+b_1$ may nominally be equal to $a_2+b_2$).

For one embodiment, the vias 141 may be laser-plated vias formed with any convention process, including, for example, a laser/drilling process that forms via openings that are then plated with an electroless Cu plating process (or the like) to form the vias 141. For one embodiment, the via openings 128 and 129 may also be formed using the laser/drilling process that enables thick and thin traces within that routing layer, where the thickness of the via opening 128 may be greater than the thickness of the via opening 129. Note that these processes are described in further detail below (e.g., in FIG. 2A-2F).

Furthermore, as illustrated, the first via pad 131a and the first trace 131c of the second conductive layer 131 may be formed in the second dielectric layer 120 to have the first trace thickness $a_1$ and the first dielectric thickness $b_1$. For one embodiment, the first trace thickness $a_1$ may be a thickness of the first trace 131c defined between the top surface of the first dielectric layer 110 and the top surface of the first trace 131c (or the top surface of the first via pad 131a). For one embodiment, the first dielectric thickness $b_1$ may be a thickness of the second dielectric layer 120 defined between the top surface of the first trace 131c (or the top surface of the first via pad 131a) and the top surface of the second dielectric layer 120.

Likewise, as illustrated, the second via pad 131b and the second trace 131d of the second conductive layer 131 may be formed in the second dielectric layer 120 to have the second trace thickness $a_2$ and the second dielectric thickness $b_2$. For one embodiment, the second trace thickness $a_2$ may be a thickness of the second trace 131d defined between the top surface of the first dielectric layer 110 and the top surface of the second trace 131d (or the top surface of the second via pad 131b). For one embodiment, the second dielectric thickness $b_2$ may be a thickness of the second dielectric layer 120 defined between the top surface of the second trace 131d (or the top surface of the second via pad 131b) and the top surface of the second dielectric layer 120. In these embodiments, the second trace thickness $a_2$ may be greater than the first trace thickness $a_1$, and the second dielectric thickness $b_2$ may be less than the first dielectric thickness $b_1$.

Note that, in alternate embodiments, the second trace thickness $a_2$ of the second trace 131d may be greater or less than the first trace thickness $a_1$ of the first trace 131c based on the desired packaging design. Likewise, also note that, in these alternate embodiments, the second dielectric thickness $b_2$ of the second dielectric layer 120 may be greater or less than the first dielectric thickness $b_1$ of the second dielectric layer 120 based on the desired packaging design.

In some embodiments, the package substrate 100 includes first and second traces 131c-d with two different thicknesses $a_1$ and $a_2$, respectively, within the same routing layer (shown as $a_2>a_1$). The trace and dielectric thicknesses $a_1$, $a_2$, $b_1$, and $b_2$ may be formed to have two or more different thicknesses that facilitate single-ended routing structures and differentiating routing structures within a single routing layer of the package substrate 100.

For one embodiment, the first thickness $a_1$ of the trace 131c and the via pad 131a may be approximately 20 μm+/−7 μm or less. In a particular embodiment, the first thickness $a_1$ of the trace 131c and the via pad 131a may be approximately 10 μm or less. For one embodiment, the second thickness $a_2$ of the trace 131d and the via pad 131b may be approximately 35 μm+/−2 μm or less. In a particular embodiment, the second thickness $a_2$ of the trace 131d and the via pad 131b may be approximately 20 μm or less. For some embodiments, the second thickness $a_2$ of the trace 131d is greater than the first thickness $a_1$ of the trace 131c. Additionally, for one embodiment, the trace 131c may also have a width of approximately 20 μm+/−7 μm or less. Additionally, for one embodiment, the trace 131d may also have a width of approximately 35 μm+/−2 μm or less. Likewise, in these embodiments, the dielectric layer 120 may be patterned to have a first dielectric thickness $b_1$ above the trace 131c and a second dielectric thickness $b_2$ above the trace 131d, where the second dielectric thickness $b_2$ may be approximately 15+/−2 μm or less, and the first dielectric thickness $b_1$ may be approximately 35+/−7 μm or less.

For alternate embodiments, the first thickness $a_1$ may be approximately similar/equal to the second thickness $a_2$ if needed. For additional embodiments, the first thickness $a_1$ and the second thickness $a_2$ within the same routing layer may each be adjusted to a specific (or desired) thickness—where $a_1$ is approximately less than $a_2$, $a_1$ is approximately equal to $a_2$, or $a_1$ is approximately greater than $a_2$—based on the electrical performance/requirements needed by the package substrate 100 (e.g., reduced crosstalk for one or more HSIO signals, improved impedance tolerances for HSIO interconnects/signals, and/or routing design flexibility benefits such as having single-ended and differential routing structures in a single routing layer).

Note that the package substrate 100 of FIGS. 1A-1B may include fewer or additional packaging components based on the desired packaging design.

FIGS. 2A-2F are illustrations of cross-sectional views of a process flow to form a package substrate 200 having vias, traces, conductive layers, and dielectric layers, where a dielectric layer includes traces and dielectric portions with different thicknesses, according to some embodiments. These embodiments as shown with respect to FIGS. 2A-2F provide the process flow that combines a lithographic plating and patterning process and a laser/drilling via process to form two or more sets of conductive features/structures (e.g., traces, vias, via pads, planes, etc.) having different desired thicknesses. The process flow illustrated with FIGS. 2A-2F uses two individual exposures steps with two different photoresists to pattern these two sets of conductive features, each set having a desired Cu thickness and a desired dielectric thickness to provide the electrical insulation needed by the desired Cu thickness. These embodiments of the package substrate 200 utilize thinner photoresists (e.g., photoresists 240 and 242) to enable finer litho-defined conductive features, such as thinner traces, vias, and via pads that may be approximately 20 μm or less. The process flow shown with FIGS. 2A-2F may improve impedance tolerances for HSIO interconnects by enabling thinner conductive features (e.g., trace 231c and via pad 231a) with thick dielectric for single-ended routing structures and thicker conductive features (e.g., trace 231d and via pad 231b) with thinner dielectric for differential routing structures to be manufactured into a single routing layer of the package substrate 200. For one embodiment, the package substrate 200 shown in FIGS. 2A-2F may be similar to the package substrate 100 of FIG. 1.

One such embodiment is illustrated and described based on FIGS. 2A-2F, which illustrates cross-sectional views of a package substrate 200 having a conductive layer with varying/different trace and dielectric thicknesses. In the illustrated embodiments, the patterning and plating of the build-up layers in the package substrate 200 is shown, however it is to be appreciated that the illustrated features are not limiting and may be formed using different processing operations. Note that well-known features of FIGS. 2A-2F are omitted or simplified in order not to obscure the illustrative implementations.

Referring back to FIG. 2A, the process flow shows the package substrate 200 having a first conductive layer 230, a first dielectric layer 210, a first photoresist layer 240, and openings 218-219 and 208 formed in the first dielectric 210 and/or the first photoresist layer 240. For one embodiment, the process flow shows disposing the first conductive layer 230 in the first dielectric 210. For one embodiment, the first dielectric 210 may be patterned to form via openings 218-219 that expose via pads of the first conductive layer 230. According to embodiments, the via openings 218-219 in the first dielectric layer 210 may be patterned with a patterning process such as direct laser/drilling writing, laser projection patterning, plasma etching, or other known patterning processes. For one embodiment, the via openings 218 and 219 may have approximately the same width and thickness. For another embodiment, the via opening 218 (or a first via opening) may have a different width/thickness than a width/thickness of the via opening 219 (or a second via opening).

For one embodiment, the first conductive layer 230 may include, but not limited to, signal lines, via pads, planes, and/or vias. In one embodiment, the first conductive layer 230 may be formed using a lithographic patterning and deposition process. According to an embodiment, the deposition process may be any suitable deposition process, such as electroless plating or the like. For one embodiment, the first conductive layer 230 may provide electrical connections to a lower build-up layer of the package substrate 200. According to an embodiment, the first conductive layer 230 and the dielectric 210 may be similar to the first conductive layer 130 and the first dielectric 110 as described above in FIG. 1A. Note that the conductive layers (e.g., the first and second conductive layers 230-231) only show portions of the traces, plane, pads, and vias.

Figure 2A:
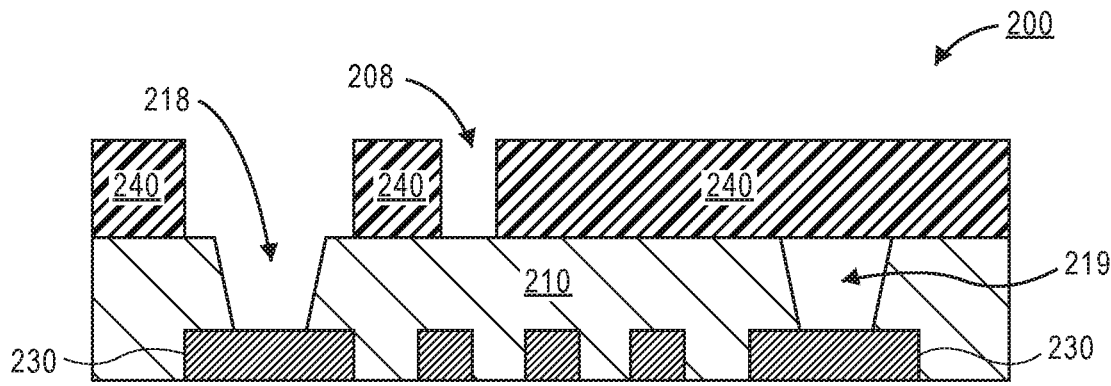
FIGS. 2A-2F are illustrations of cross-sectional views of a process flow to form a package substrate having vias, traces, conductive layers, and dielectric layers, where a dielectric layer includes traces and dielectric portions with different thicknesses, according to some embodiments.

The process of FIG. 2A also illustrates disposing/laminating and patterning a first photoresist layer 240 to form first openings 218 and 208 respectively above the first conductive layer 230 and the first dielectric layer 210. For one embodiment, the first photoresist layer 240 may be a dry-film photoresist (DFR) having a thickness of approximately 30 μm or less, which enables thinner litho-defined conductive features (e.g., trace 231c and via pad 231a of FIG. 2B). In one embodiment, the first openings of the first photo resist layer 240 include a via opening 218 through the first photoresist layer 240 and the first dielectric layer 210, and a trace opening 208 through the first photoresist layer 240. According to one embodiment, the first photoresist layer 240 may be formed over the first dielectric layer 210 and patterned to provide openings for the formation of one or more thinner traces and via pads (e.g., trace 231c and via pad 231a of FIG. 2B). According to an embodiment, the patterning of the first photoresist layer 240 may be implemented with lithographic processes (e.g., exposing the first photoresist layer 240 with a radiation source through a mask and developed with a developer to pattern the first openings 218 and 208). After the first photoresist layer 240 has been patterned, a thin trace, a thin via pad, and a via may be formed.

Figure 2B:
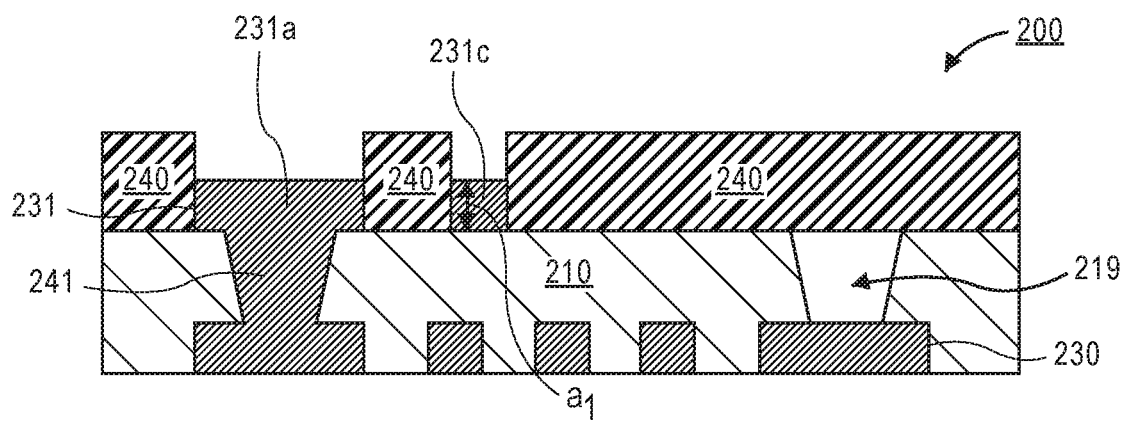

FIG. 2B illustrates the process flow depositing a conductive material into the first openings to form a first via 241 on the first conductive layer 230, a first via pad 231a on the first via 241, and a first trace 231c on the first dielectric layer 210 (i.e., this step may be referred to as a first metal deposition process). For one embodiment, a second conductive layer 231 is disposed above the first dielectric layer 210 and the first conductive layer 230, where the second conductive layer 231 includes the first via pad 231a and the first trace 231c. In an embodiment, the first via pad 231a and the first trace 231c of the second conductive layer 231 may be formed with an electroless plating process or the like.

For one embodiment, the first via pad 231a and the first trace 231c are formed to have a first thickness $a_1$. For one embodiment, the first thickness $a_1$ of the first via pad 231a and the first trace 231c may be approximately 20 μm+/−7 μm or less. In a particular embodiment, the first thickness $a_1$ of the first via pad 231a and the first trace 231c may be approximately 10 μm or less. For one embodiment, the first trace 231c may have a width of approximately 20 μm+/−7 μm or less. According to one embodiment, the first patterning and plating process (as shown with FIG. 2B) provides a thinner trace 231c and a thinner via pad 231a which may have thicker electrical insulations, including a narrow trace width for trace 231c, a wide trace spacing for trace 231c, and a thicker dielectric above and below the trace 231c (as shown below in FIG. 2C). For example, the first trace 231c may be used for single-ended routing.

Figure 2C:
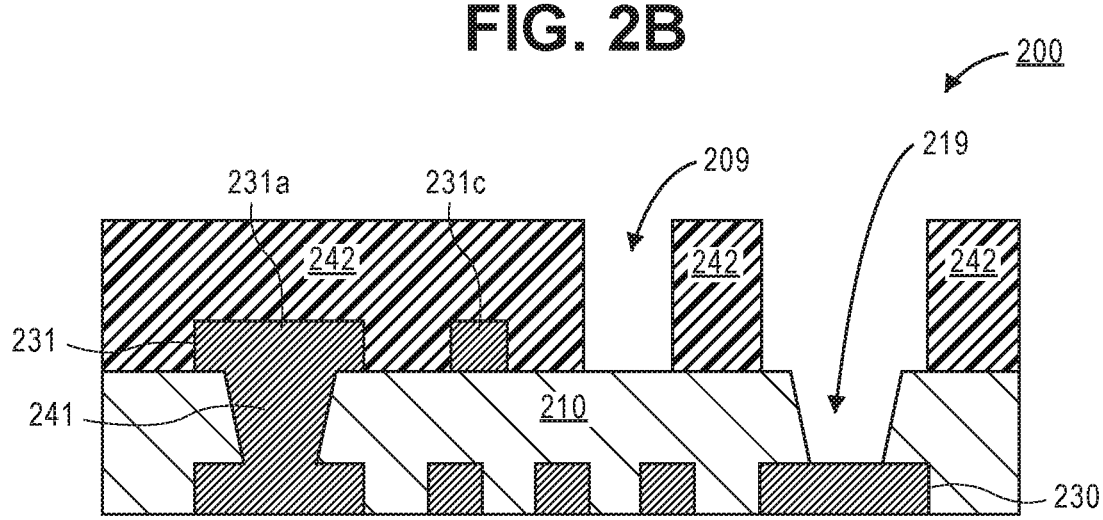

FIG. 2C illustrates the process flow removing/striping the first photoresist layer 240, and disposing a second photoresist layer 242 over the first via pad 231a, the first trace 231c, and the first dielectric 210. For one embodiment, the second photoresist layer 242 is disposed and patterned to form second openings 219 and 209 respectively above the first conductive layer 230 and the first dielectric. For one embodiment, the second photoresist layer 242 may be a dry-film photoresist (DFR) having a thickness of approximately 45 μm or less, which enables thicker litho-defined conductive features (e.g., trace 231d and via pad 231b of FIG. 2D). As such, the second photoresist layer 242 may have a thickness that is greater than a thickness of the first photoresist layer 240.

In one embodiment, the second openings of the second photoresist layer 242 include a via opening 219 through the second photoresist layer 242 and the first dielectric layer 210, and a trace opening 209 through the second photoresist layer 242. According to one embodiment, the second photoresist layer 242 may be formed over the first dielectric layer 210 and patterned to provide openings for the formation of one or more thicker traces and via pads (e.g., trace 231d and via pad 231b of FIG. 2D). According to an embodiment, the patterning of the second photoresist layer 242 may be implemented with lithographic processes (e.g., exposing the second photoresist layer 242 with a radiation source through a mask and developed with a developer to pattern the second openings 219 and 209). After the second photoresist layer 242 has been patterned, a thicker trace, a thicker via pad, and a via may be formed.

Figure 2D:
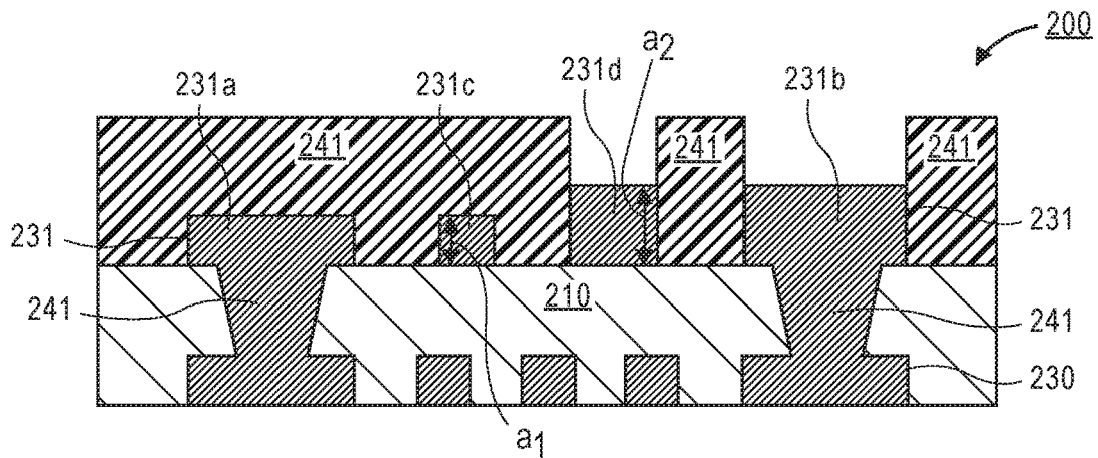

FIG. 2D illustrates the process flow depositing a conductive material into the second openings to form a second via 241 on the first conductive layer 230, a second via pad 231b on the second via 241, and a second trace 231d on the first dielectric layer 210 (i.e., this step may be referred to as a second metal deposition process). For one embodiment, the first via 241 and the second via 241 have approximately the same thickness. For one embodiment, the second conductive layer 231 is further disposed above the first dielectric layer 210 and the first conductive layer 230, where the second conductive layer 231 also includes the second via pad 231*b* and the second trace 231*d*. In an embodiment, the second via pad 231*b* and the second trace 231*d* of the second conductive layer 231 may be formed with an electroless plating process or the like.

As illustrated, for one embodiment, the second via pad 231*b* and the second trace 231*d* are formed to have a second thickness $a_2$ that is different than the first thickness $a_1$, as the first via pad 231*a* and the first trace 231*c* are protected from further metal deposition by the second photoresist layer 242. For one embodiment, the second thickness $a_2$ of the second via pad 231*b* and the second trace 231*d* may be approximately 35 µm+/−2 µm or less. In a particular embodiment, the second thickness $a_2$ of the second via pad 231*b* and the second trace 231*d* may be approximately 20 µm or less. For one embodiment, the second trace 231*d* may have a width of approximately 35 µm+/−2 µm or less. According to one embodiment, the second patterning and plating process (as shown with FIG. 2D) provides a thicker trace 231*d* and a thicker via pad 231*b* which may have thinner electrical insulations, including a wide trace width for trace 231*d*, a narrow trace spacing for trace 231*d*, and a thicker dielectric above and below the trace 231*d* (as shown below in FIG. 2E). For example, the second trace 231*d* may be used for differential routing. Accordingly, in this illustrated routing layer of the package substrate 200, the second trace 231*d* has the second thickness $a_2$ that is greater than the first thickness $a_1$ of the first trace 231*c*, which enables single-ended routing via trace 231*c* and differential routing via trace 231*d* within the same routing layer.

Figure 2E:
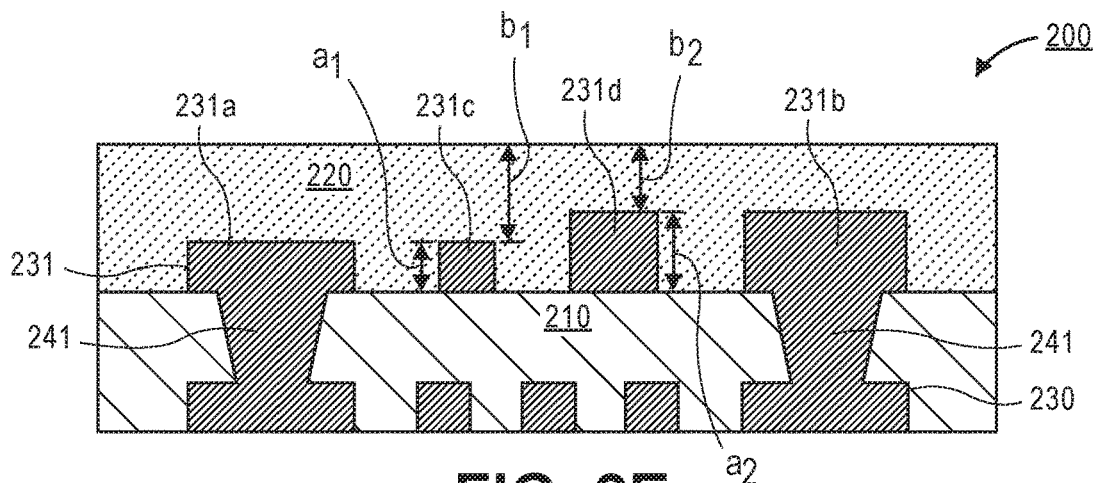

FIG. 2E illustrates the process flow removing the second photoresist layer 242, and disposing a second dielectric layer 220 over the second conductive layer 231 and the first dielectric layer 210. For one embodiment, after the second photoresist layer 242 is removed, the process flow may include a fast etching process or the like prior to disposing the second dielectric layer 220. For one embodiment, the second dielectric layer 220 may be a build-up film layer (e.g., an ABF layer). According to an embodiment, the second dielectric layer 220 may be formed with any suitable process, such as lamination or slit coating and curing. In an embodiment, the second dielectric layer 220 is formed to a thickness that will completely cover the top surfaces of the second conductive layer 231, where the second dielectric layer 220 has a first dielectric thickness $b_1$ that is greater than a second dielectric thickness $b_2$. For one embodiment, the first dielectric thickness $b_1$ formed above the first trace 231*c* enables thicker electrical insulation for the thin first trace 231*c*, which helps mitigate noise and crosstalk. As opposed to layer formation on crystalline structures (e.g., silicon substrates), each of the dielectric layers may not be highly uniform. Accordingly, the second dielectric layer 220 may be formed to a thickness (e.g., a thickness of approximately 55 µm or less) that is greater than the thickness $a_2$ of the second trace 231*d* and the second via pad 231*b* to ensure that the proper thickness is reached across the entire substrate.

Figure 2F:
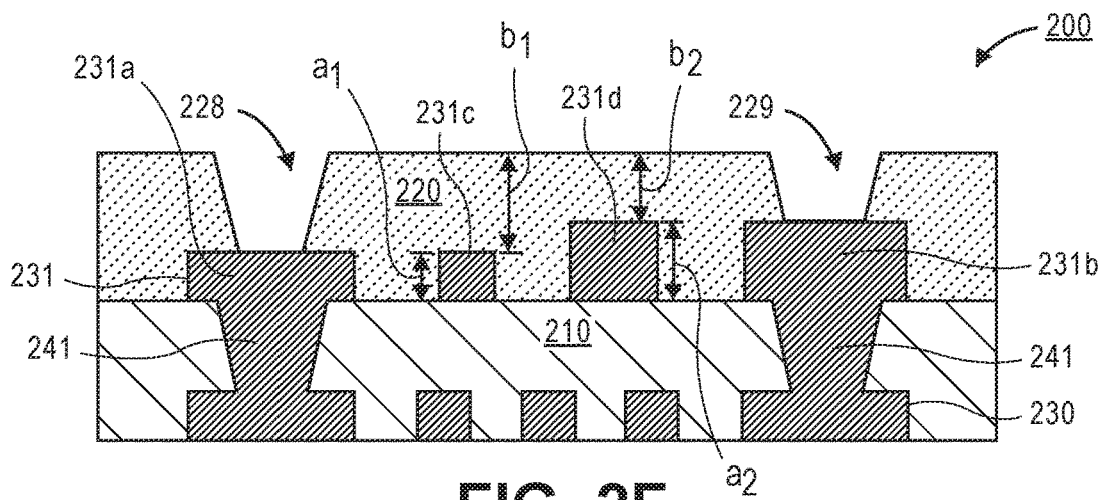

FIG. 2F illustrates the process flow 200 patterning the second dielectric layer 220 to form a via opening 228 (or a third via opening) to expose the first via pad 231*a*, and a via opening 229 (or a fourth via opening) to expose the second via pad 231*b*. For one embodiment, a thickness of the via opening 228 (e.g., a thickness of approximately 35 µm or less) is greater than a thickness of the via opening 229 (e.g., a thickness of approximately 20 µm or less). For example, when the second dielectric layer 220 is formed above the thickness $a_2$ of the second trace 231*d* and the second via pad 231*b*, the second dielectric layer 220 may use a laser/drilling via process to expose the top surfaces of the via pads 231*a-b*.

In an embodiment, the laser/drilling via process may be implements by applying specific laser via drilling recipes to designated areas (i.e., performed only proximate to the via pads 231*a-b*) on the second dielectric layer 220 to expose the via pads 231*a-b*. For alternate embodiments, the via pads 231*a-b* may be exposed using a chemical mechanical polishing (CMP) process, a mechanical grinding process, a wet or dry etching process, a wet blast, a laser ablation (e.g., by using excimer laser), and/or a combination thereof.

For one embodiment, after the laser/drilling via process, the process flow may further include a desmear step and then a semi-additive patterning (SAP) process, where these combined processes may lead to an undercut of the outer edge of the via bottom opening (e.g., via openings 228-229) that may create an anchor point for via integrity and result in a curve Cu grain boundary (as opposed to a roughly horizontal/flat Cu grain boundary).

According to some embodiments, the via openings 228-229 are used to form a third via 251 and a fourth via 252 with different thicknesses, where the third and fourth vias 251-252 are formed using a third deposition process as the third and fourth vias 251-252 may include higher tapered shapes (e.g., approximately greater than 90 degree tapers) and curved Cu grain boundaries (i.e., the bottom surfaces of the third and fourth vias 251-252 may not be flat/horizontal and be respectively recessed below the topmost surfaces of the first via pad 231*a* and the second via pad 231*b*). In one embodiment, the third and fourth vias 251-252 may be disposed on curved Cu grain boundaries that are respectively formed on the top surfaces of the first via pad 231*a* and the second via pad 231*b*, where the bottom surfaces of the third and fourth vias 251-252 may be respectively recessed below the topmost surfaces of the first via pad 231*a* and the second via pad 231*b*.

In one embodiment, the third via 251 having a third thickness is disposed on the first via pad 231*a* having the first thickness $a_1$, where the third via 251 is disposed in the second dielectric layer 220. Additionally, in another embodiment, the fourth via 252 having a fourth thickness is disposed on the second via pad 231*b* having the second thickness $a_2$, where the fourth via 252 is disposed in the second dielectric layer 220, where the third thickness of the third via 251 may be greater than the fourth thickness of the fourth via 252. In one embodiment, the third and fourth vias 251-252 are formed as are tapered vias. In one embodiment, a bottom surface of the fourth via 252 is located above a bottom surface of the third via 251. For another embodiment, the fourth thickness of the fourth via 252 in the second dielectric layer 220 may be less than a thickness of the vias 241 in the first dielectric layer 210.

The third and fourth vias 251-252 may be formed as laser vias (e.g., as compared to litho-defined/plated vias). For one embodiment, these subsequent third and fourth vias 251-252 may be formed using similar steps as described in FIGS. 2A-2D. Additionally, in theses embodiments, the via openings 228-229 may be used to drill and plate these subsequent third and fourth vias 251-252, where a thickness of the third via 251 is greater than a thickness of the fourth via 252, and where the third and fourth vias 252-252 may be disposed on two or more Cu features with different thicknesses, such as the different thicknesses $a_1$ and $a_2$ of the first via pad 231*a* and the second via pad 231*b* respectively, within the same routing layer. Accordingly, the embodiments of the third and fourth vias 251-252 in the second dielectric layer improve packaging solution—as existing via stacks/formations are typically limited to vias landing (or disposed) on the first patterned and thickest via pads of a conductive layer—by enabling the vias 251-252 to be respectively drilled and plated onto the two via pads 231*a-b* (or two or more Cu structures) in the same layer, while the two via pads 231*a-b* have different thicknesses.

Note that the steps shown in FIGS. 2A-2F may be repeated to form an additional routing layer above the second dielectric 220, where the additional routing layer may also have Cu features/structures with different trace and dielectric thicknesses (as described herein).

Also note that the package substrate 200 as shown with the process flow of FIGS. 2A-2F may include fewer or additional packaging components and steps based on the desired packaging design.

FIG. 3 illustrates a semiconductor package 300 including a die 314, a substrate 312 (or an interposer), interconnect structures (e.g., the plurality of bumps disposed below the die 314 and the substrate 312), and the package substrate 302, where the substrate 312 and/or the package substrate 302 may have build-up structures with two or more varying trace and dielectric thicknesses within the same routing layer (or build-up layer), according to some embodiments. For one embodiment, the semiconductor package 300 may implement the substrate 312 and/or the package substrate 302 to include a build-up structure 350 (as described herein) having vias, traces, conductive layers, and dielectric layers, where a dielectric layer includes traces and dielectric portions with different thicknesses, according to one embodiment.

For one embodiment, the build-up structure 350 of the substrate 312 and/or the package substrate 302 may be similar to the package substrates of FIGS. 1-2 and 5-6. Note that the semiconductor package 300 is not limited to the illustrated semiconductor packaged system, and thus may be designed/formed with fewer, alternate, or additional packaging components and/or with different interconnecting structures. Also note that the embodiments described herein allow variations in trace and dielectric thicknesses anywhere in (or throughout) the substrate (i.e., the variations in thicknesses are not limited to one single routing layer), which includes applications that may need multiple build-up layers (e.g., approximately ten routing layers or more).

For one embodiment, the semiconductor package 300 may include one or more build-up structures 350 implementing a conductive layer in a dielectric layer, the conductive layer has a first trace with a first thickness and a second trace with a second thickness, and the second thickness of the second trace is greater than the first thickness of the first trace. These build-up structures 350 enable the semiconductor package 300 to have improved electrical performances while allowing single-ended routing and differential routing structures to be disposed in the same build-up layer (e.g., as shown in FIGS. 1A-1B, 2F, 5G, and 6G). Note that the package substrate 302 and/or the substrate 312 may be similar to the package substrates of FIGS. 1-2 and 5-6.

According to one embodiment, the semiconductor package 300 is merely one example of an embodiment of a semiconductor packaged system. For one embodiment, the semiconductor package 300 may include a land grid array (LGA) package and/or a pin grid array (PGA) package. For one embodiment, a die 314 (or an integrated circuit die) is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a printed circuit board (PCB), and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers (e.g., the first and second dielectric layers 110 and 120 of FIG. 1A), where each dielectric layer can be a photosensitive dielectric layer. For some embodiments, holes may be drilled in the PCB 302. For one embodiment, the PCB 302 may also include conductive layers (e.g., the first and second conductive layers 130-131 of FIG. 1A) that comprise copper lines/traces, metallic pads, vias, via pads, planes, and/or holes.

For one embodiment, the die 314 may include, but is not limited to, a semiconductor die, an electronic device (e.g., a wireless device), an integrated circuit, a central processing unit (CPU), a microprocessor, a platform controller hub (PCH), a memory, and a field-programmable gate array (FPGA). The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, Cu).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor package 300 may include fewer or additional packaging components based on the desired packaging design.

Figure 4:
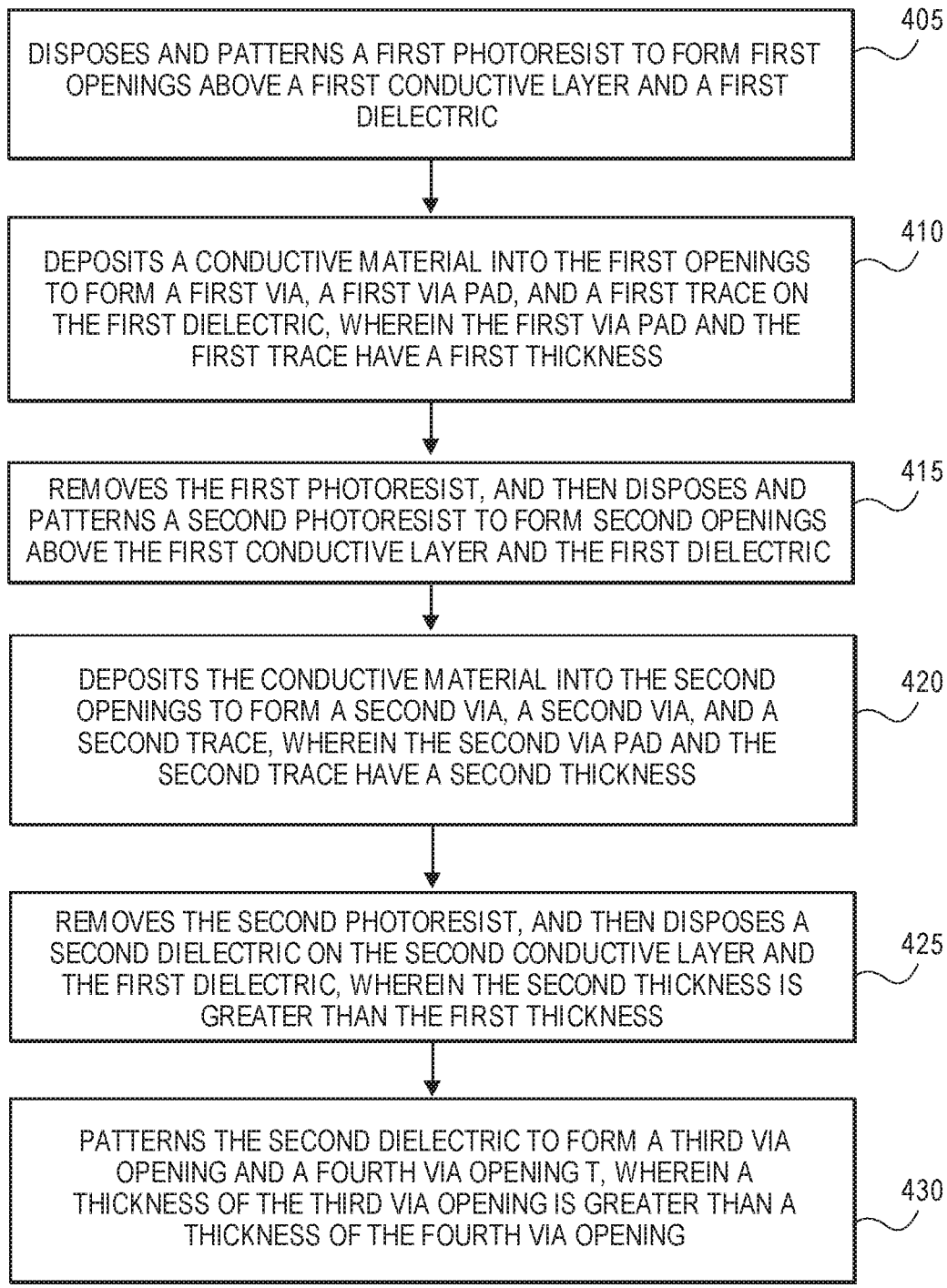
FIG. 4 is an illustration of a process flow illustrating a method of forming a package substrate having vias, traces, conductive layers, and dielectric layers, where a dielectric layer includes traces and dielectric portions with different thicknesses, according to one embodiment.

FIG. 4 is a process flow 400 illustrating a method of forming a package substrate having vias, traces, conductive layers, and dielectric layers, where a dielectric layer includes traces and dielectric portions with different thicknesses, according to one embodiment. For one embodiment, the process flow 400 includes one or more steps used to form the semiconductor packages (or package substrates) as described herein (e.g., the package substrates 100 of FIGS. 1A-1B and 200 of FIGS. 2A-2F). According to one embodiment, the process flow 400 may be similar to the process flow illustrated with FIGS. 2A-2F. Specifically, the process flow 400 may be used to form a routing layer that has a conductive layer disposed in a dielectric layer, the conductive layer has a first trace with a first thickness and a second trace with a second thickness, and the second thickness of the second trace may be greater than the first thickness of the first trace (e.g., as shown with traces 131c-d of FIGS. 1A and 1D), according to one embodiment.

At block 405, the process flow 400 disposes and patterns a first photoresist to form first openings above a first conductive layer and a first dielectric, where the first conductive layer is disposed in the first dielectric (e.g., as shown in FIG. 2A). At block 410, the process flow 400 deposits a conductive material into the first openings to form a first via on the first conductive layer, a first via pad on the first via, and a first trace on the first dielectric, where the first via pad and the first trace have a first thickness (e.g., as shown in FIG. 2B). At block 415, the process flow 400 removes the first photoresist, and then disposes and patterns a second photoresist to form second openings above the first conductive layer and the first dielectric (e.g., as shown in FIG. 2C).

At block 420, the process flow 400 deposits the conductive material into the second openings to form a second via on the first conductive layer, a second via pad on the second via, and a second trace on the first dielectric, where the second via pad and the second trace have a second thickness, and wherein the first via pad, the second via pad, the first trace, and the second trace form a second conductive layer (e.g., as shown in FIG. 2D). At block 425, the process flow 400 removes the second photoresist, and then disposes a second dielectric on the second conductive layer and the first dielectric, where the second thickness is greater than the first thickness (e.g., as shown in FIG. 2E). At block 430, the process flow 400 patterns the second dielectric to form a third via opening to expose the first via pad, and a fourth via opening to expose the second via pad, where a thickness of the third via opening is greater than a thickness of the fourth via opening (e.g., as shown in FIG. 2F).

Additionally, as described above, the process flow may implement two patterning steps within a single routing layer to provide two different thickness for the traces and the dielectric portions in that layer. In addition, the two patterning steps of the process flow do not have to overlap to create the routing layer which enables varying thicknesses for the traces and the dielectric portions in that layer. The process flow may also implement a laser drilling process to enable thick and thin traces within the single routing layer without requiring a combined litho and planarization process (e.g., as needed in the LIV process).

Note that the semiconductor package formed by process flow 400 may include fewer or additional packaging components based on the desired packaging design (e.g., as shown in FIGS. 1-3).

FIGS. 5A-5G are illustrations of cross-sectional views of a process flow to form a package substrate 500 having vias 541a-b, traces 531c-d, conductive layers 530-532, and dielectric layers 510a-b and 520a-b on a substrate 550, where a dielectric layer 520a includes via pads 531a-b, traces 531c-d, and dielectric portions $b_1$ and $b_2$ with different thicknesses, according to some embodiments.

These embodiments as shown with respect to FIGS. 5A-5G provide the process flow that combines a lithographic plating and patterning process and a laser/drilling via process to form two or more sets of conductive features/structures (e.g., traces, vias, via pads, planes, etc.) having different desired thicknesses. The process flow illustrated with FIGS. 5A-5G uses two individual exposures steps with two different photoresists—where a first photoresist having a front-side photoresist layer and a back-side photoresist layer that may be patterned as asymmetric photoresist layers (i.e., the front-side photoresist layer may have a thickness that is less than a thickness of the back-side photoresist layer)—to pattern these two sets of conductive features, each set having a desired Cu thickness and a desired dielectric thickness to provide the electrical insulation needed by the desired Cu thickness. These embodiments of the package substrate 500 may utilize thinner and/or asymmetric photoresists (e.g., photoresists 540 and 542) to enable finer litho-defined conductive features, such as thinner traces, vias, and via pads that may be approximately 15 μm or less.

The process flow shown with FIGS. 5A-5G may improve impedance tolerances for HSIO interconnects by enabling thinner conductive features (e.g., trace 531c and via pad 531a) with thick dielectric for single-ended routing structures and thicker conductive features (e.g., trace 531d, via pad 531b, and conductive layer 532) with thinner dielectric for differential routing structures to be manufactured into a single routing layer of the package substrate 500. For one embodiment, the package substrate 500 shown in FIGS. 5A-5G may be similar to the package substrate 100 of FIG. 1, but the package substrate 500 may include the substrate 550 having front and back sides (i.e., top and bottom surfaces) and thicker conductive features (e.g., trace 531d and via pad 531b), where the thicker conductive features may have a diameter (or width) that is greater than a diameter (or width) of the thinner conductive features (e.g., trace 531c and via pad 531a). In these embodiments, the process flow shown with FIGS. 5A-5G may enable (i) disposing (or forming) finer/thinner features on the top surface of the substrate, (ii) matching thicker features on the bottom surface of the substrate, while forming thicker features above/on the thinner features to form thicker features with offsetting thicknesses and diameters/widths (e.g., as shown with trace 531d and via pad 531b of FIG. 5G), (iii) improved alignment of the litho-defined Cu features, and (iv) disposing finer/thinner features (e.g., of roughly 9/12 μm towards 2/2 μm or less) to increase space and routing density (i.e., allow for optimal routing density).

One such embodiment is illustrated and described based on FIGS. 5A-5G, which illustrates cross-sectional views of a package substrate 500 having a conductive layer with varying/different trace and dielectric thicknesses. For some embodiments, the conductive layers 530-532 (including the vias, traces, and via pads), the dielectric layers 510a-b and 520a-b, and photoresist layers 540a-b and 542 of the package substrate 500 shown in FIGS. 5A-5G may be similar to the conductive layers 130-131 (including the vias, traces, and via pads), the dielectric layers 110 and 120, and photoresist layers 140 and 142 of the package substrate 100 of FIG. 1A (e.g., the components of the package substrate 500 shown in FIGS. 5A-5G may be formed using the same or similar processes (and/or materials) as the package substrate 100 of FIG. 1A). In the illustrated embodiments, the patterning and plating of the build-up layers in the package substrate 500 is shown, however it is to be appreciated that the illustrated features are not limiting and may be formed using different processing operations. Note that well-known features of FIGS. 5A-5G are omitted or simplified in order not to obscure the illustrative implementations.

Figure 5A:
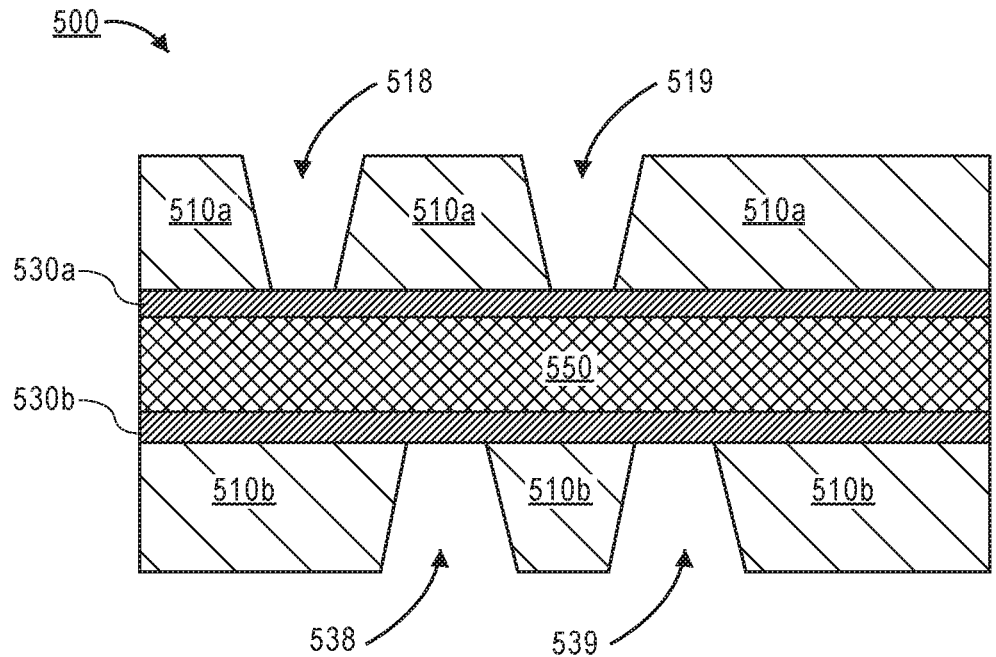
FIGS. 5A-5G are illustrations of cross-sectional views of a process flow to form a package substrate having vias, traces, conductive layers, and dielectric layers on a substrate, where a dielectric layer includes traces and dielectric portions with different thicknesses, according to some embodiments.

FIG. 5A illustrates the package substrate 500 including a substrate 550, first conductive layers 530a-b, first dielectric layers 510a-b, and openings 518-519 (or first and second top openings) and 538-539 (or first and second bottom openings). The substrate 550 may include first conductive layers 530a-b, where the first conductive layers include 530a-b include a first top conductive layer 530a and a first bottom conductive layer 530b. For one embodiment, the substrate 550 may be a core substrate and/or a coreless substrate. In this embodiment, as shown in FIGS. 5A-5G, the substrate 550 is a core substrate (or the like). The first top conductive layer 530a may be disposed on a top surface of the substrate 550 (also referred to as the front-side of the substrate 550), and the first bottom conductive layer 530b may be disposed on a bottom surface of the substrate 550 (also referred to as the back-side of the substrate 550). Note that, as described herein, the process flow shown in FIGS. 5A-5G may be implemented on both front/back sides of the substrate approximately at the same time.

The package substrate 500 also include first dielectric layers 510a-b and openings 518-519 and 538-539. The first dielectric layers 510a-b may be disposed on/above the first conductive layers 530a-b, respectively. In one embodiment, the first dielectric layer 510a is patterned to form the openings 518-519 that expose surface portions of the first top conductive layer 530a. Likewise, in one embodiment, the first dielectric layer 510b is patterned to form the openings 538-539 that expose surface portions of the first bottom conductive layer 530b. For one embodiment, each of the via openings 518-519 and 538-539 may have approximately the same width and thickness. For another embodiment, one or more of the via openings 518-519 and 538-539 may have a different width/thickness than a width/thickness of the other via openings 518-519 and 538-539.

Figure 5B:
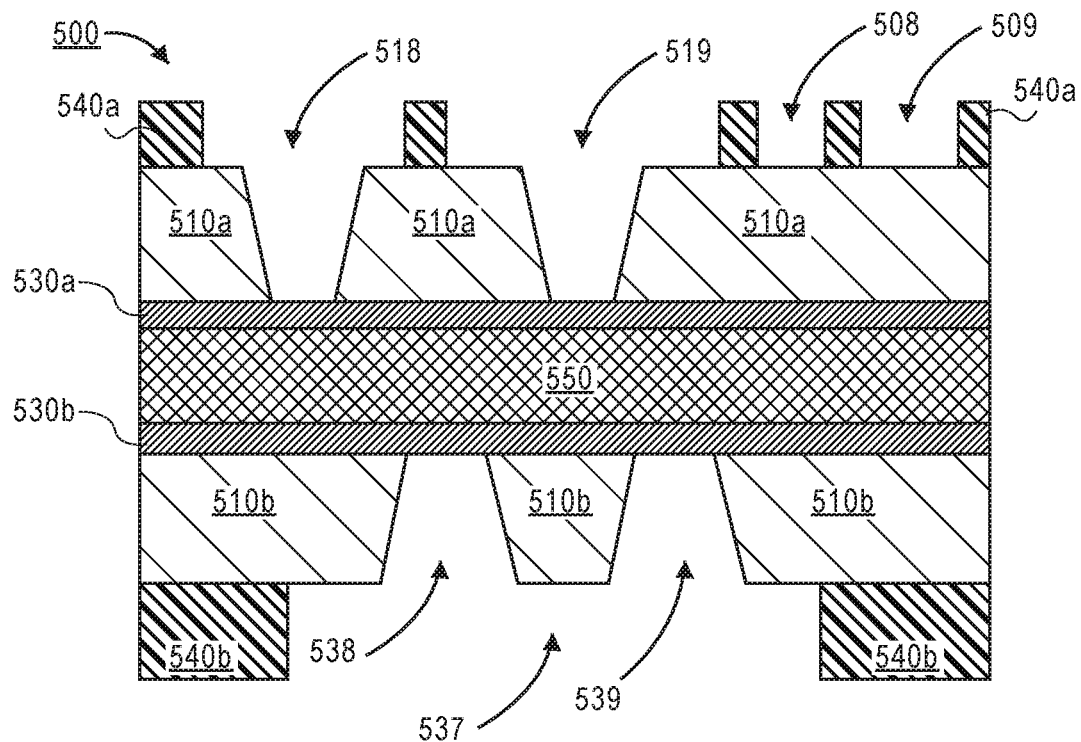

FIG. 5B illustrates disposing and patterning (i) a first photoresist layer 540a to form via openings 518-519 and trace openings 508-509 on the first dielectric layer 510a, and (ii) a first photoresist layer 540b to form openings 537-539 on the first dielectric layer 510b. For one embodiment, the first photoresist layer 540a may be a DFR (or a DFR F-side) having a thickness of approximately 25 μm or less, which enables thinner litho-defined conductive features (e.g., trace 531c and via pad 531a of FIG. 5G). For another embodiment, the first photoresist layer 540b may be a DFR (or a DFR B-side) having a thickness of approximately 35 μm or less, which enables thinner and/or thicker litho-defined conductive features (e.g., the thinner conductive layer 532 of FIG. 5D and/or the thicker conductive layer 532 of FIG. 5G).

In one embodiment, the first top openings of the first photo resist layer 540a include via openings 518-519 through the first photoresist layer 540a and the first dielectric layer 510a, and trace openings 508-509 through the first photoresist layer 540a. In one embodiment, the first bottom openings of the first photo resist layer 540b include via openings 537-539 through the first photoresist layer 540b and the first dielectric layer 510b. According to one embodiment, the first photoresist layers 540a-b may be formed over the first dielectric layers 510a-b and patterned to provide openings for the formation of one or more thinner traces, via pads, and layers/planes (e.g., trace 531c, via pad 531a, and layers/planes 532 of FIG. 5C).

Figure 5C:
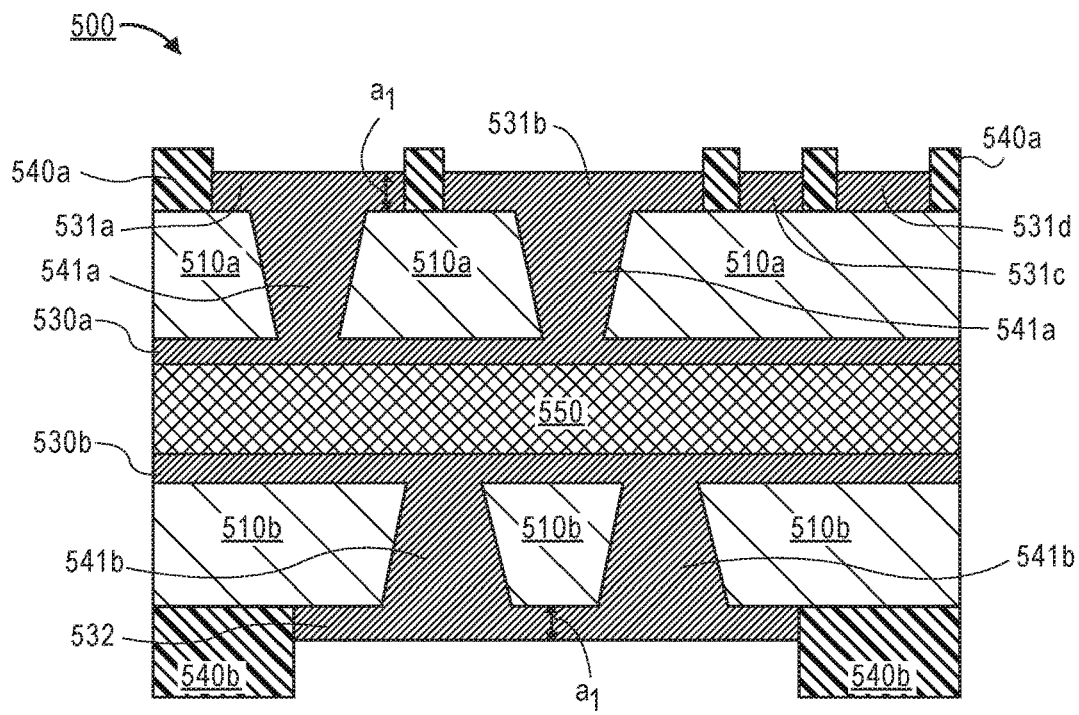

FIG. 5C illustrates the process flow depositing a conductive material into the first top openings to form top vias 541a on the first top conductive layer 530a, via pads 531a-b on the top vias 541a, and traces 531c-d on the first dielectric layer 510a. The process flow also illustrates depositing the conductive material into the first bottom openings to form bottom vias 541b on the first bottom conductive layer 530b, and a third conductive layer 532 on the first dielectric layer 510b and the bottom vias 541b. For one embodiment, a second conductive layer 531 is disposed above the first dielectric layer 510a, the top vias 541a, and the first conductive layer 530a, where the second conductive layer 531 may include the via pads 531a-b and the traces 531c-d. In an embodiment, the third conductive layer 532 is disposed above the first dielectric layer 510b, the bottom vias 541b, and the first conductive layer 530b.

For one embodiment, each of the conductive features of the second and third conductive layers 531-532 are formed to initially have a first thickness $a_1$. For one embodiment, the first thickness $a_1$ of each of the conductive features of the second and third conductive layers 531-532 may be approximately 15 μm or less. According to one embodiment, the first patterning and plating process (as shown with FIGS. 5B-5C) provides, for example, a thinner trace 531c and a thinner via pad 531a which may have thicker electrical insulations, including a narrow trace width for trace 531c, a wide trace spacing for trace 531c, and a thicker dielectric above and below the trace 531c (as shown below in FIG. 5G). For example, the trace 531c may be used for single-ended routing. Additionally, in an alternate embodiment, the first patterning and plating process (as shown with FIGS. 5B-5C) may enable the third conductive layer 532 to maintain, for example, a thinner conductive layer (e.g., a thickness of approximately 15 μm or less) by covering the opening (e.g., opening 537 as shown in FIG. 5D) above the third conductive layer 532 with a subsequent photoresist layer (e.g., a second photoresist layer 542 as shown in FIG. 5D).

Figure 5D:
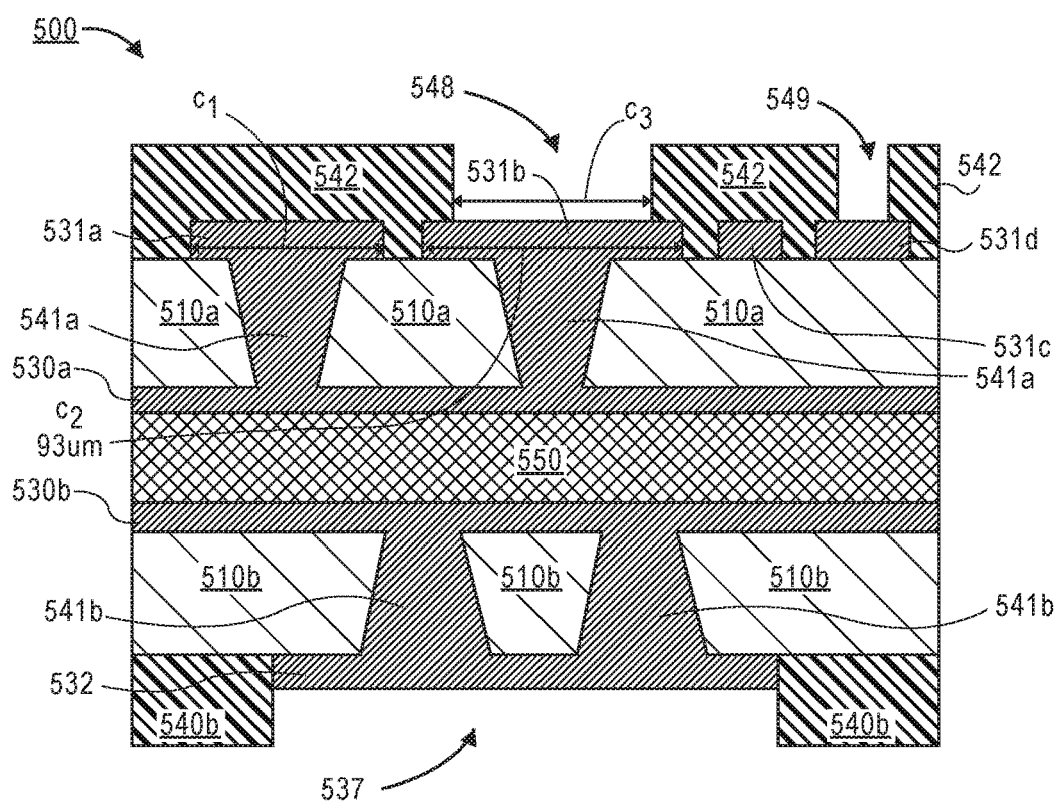

FIG. 5D illustrates disposing a second photoresist layer 542 over the second conductive layer 531 and the first photoresist layer 540a. For one embodiment, the second photoresist layer 542 is disposed and patterned to form openings 548 and 549 (or top offsetting openings) respectively above the via pad 531b and the trace 531d. For one embodiment, the second photoresist layer 542 may be a DFR having a thickness of approximately 35 μm or less, which enables thicker litho-defined conductive features (e.g., trace 531d and via pad 531b of FIG. 5G). As such, the second photoresist layer 542 may have a thickness that is greater than a thickness of the first photoresist layer 540a. Note that the second photoresist layer 542 may be formed as a combination of the first photoresist layer 540a and the second photoresist layer 542.

In one embodiment, the openings of the second photoresist layer 542 include a via pad opening 548 formed above a top surface portion of the via pad 531b, and a trace opening 549 formed above a top surface portion of the trace 531d. For one embodiment, the via pad 531a may have a diameter (or width) of approximately 77 µm or less, and the via pad 531b may have a diameter of approximately 93 µm or less. In some embodiments, for power delivery requirements, the via opening 548 may have a diameter (or width) of approximately 77 µm or less (i.e., the exposed top surface portion of the trace 531d may have a diameter of approximately 77 µm or less) to be approximately equal to the diameter of the via pad 531a. For example, the second photoresist layer 542 may be patterned to form the opening 548 with an alignment (or offset) of approximately 8 µm or less from the outer edge(s) of the via pad 531b to the inner wall(s) of the opening 548.

Figure 5E:
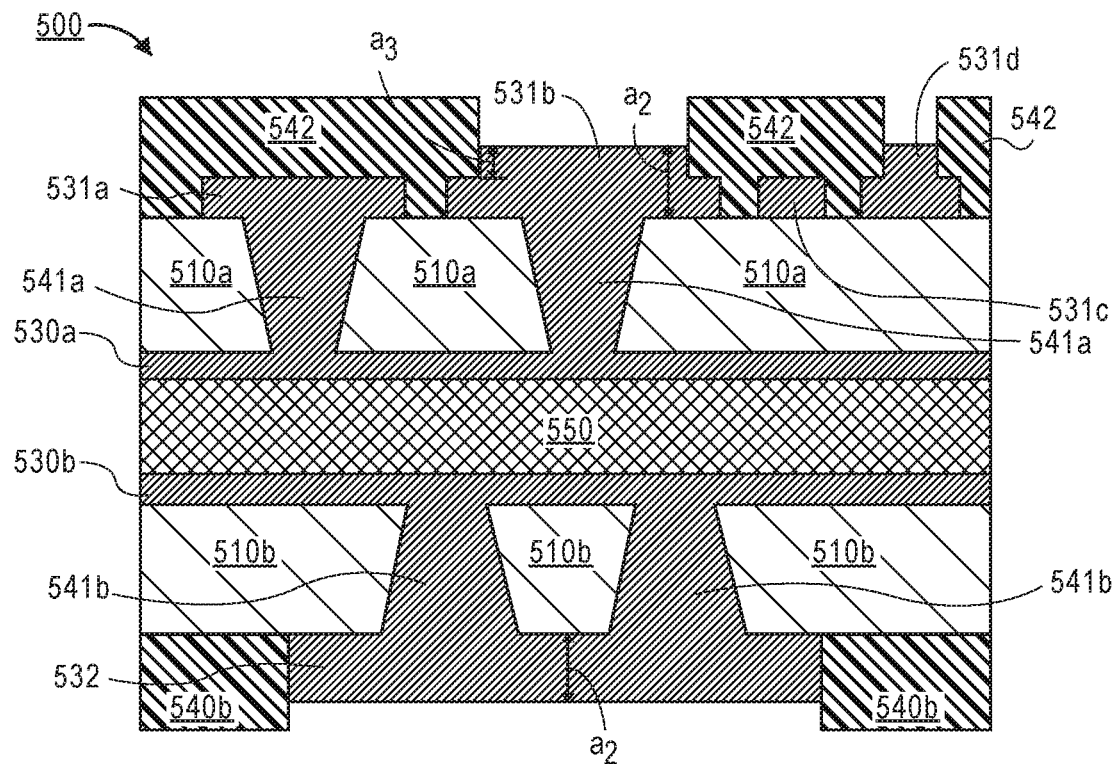

FIG. 5E illustrates the process flow depositing a conductive material into the openings 548-549 (as shown in FIG. 5D) to respectively (and ultimately) form a via pad 531b (or an offsetting-shaped via pad) on one of the top vias 541a, and a trace 531d (or an offsetting-shaped trace) on the first dielectric layer 510a (i.e., this step may be referred to as a second metal deposition process). The process flow also illustrates depositing the conductive material into the opening 537 (as shown in FIG. 5D) to ultimately form the third conductive layer 532 on the first dielectric layer 510b and the bottom vias 541b.

As described herein, "offsetting-shaped" refers to a conductive feature (e.g., a via pad, a trace, etc.) having two or more different thicknesses and/or diameters (or widths). For example, the conductive feature may have a second pad (or trace) disposed on a first pad (or trace), where the conductive feature may have two different thicknesses that include a first thickness for the outer edges of the first pad, and a second thickness for the combined/stacked thicknesses of the first pad and the second pad (e.g., as shown with the via pad 531b).

As illustrated, for one embodiment, the via pad 531b, the trace 531d, and the third conductive layer 532 are formed to have a second thickness $a_2$ that is different than the first thickness $a_1$, as the via pad 531a and the trace 531c are protected from further metal deposition by the second photoresist layer 542. Also note, as illustrated in these embodiments, the via pad 531b and the trace 531d are formed to have two different thicknesses, which include a first thickness $a_1$ for the outer edges of the first metal pad/trace deposition, and a second thickness $a_2$ for the combined thicknesses of the first thickness $a_1$ and a third thickness $a_3$ of the second metal pad/trace deposition (i.e., $a_2=a_1+a_3$).

For one embodiment, the second thickness $a_2$ of the via pad 531b, the trace 531d, and the third conductive layer 532 may be approximately 25 µm or less. For one embodiment, the via pad 531d may have two different diameters, which include a first diameter $c_2$ for the outer diameter of the first metal pad deposition, and a second diameter $c_3$ for the inner diameter of the stacked second metal pad deposition (i.e., the first diameter $c_2$ is greater than the second diameter $c_3$). Additionally, in some embodiments, the via pad 531a has a diameter $c_1$ that is approximately equal to the second diameter $c_3$ of the via pad 531b. According to one embodiment, the second patterning and plating process provides a thicker trace 531d and a thicker via pad 531b which may have thinner electrical insulations, including a wide trace width for trace 531d, a narrow trace spacing for trace 531d, and a thicker dielectric above and below the trace 531d (as shown below in FIG. 5G). For example, the trace 531d may be used for differential routing. Accordingly, in this illustrated routing layer of the package substrate 500, the trace 531d has the second thickness $a_2$ that is greater than the first thickness $a_1$ of the trace 531c, which enables single-ended routing via trace 531c and differential routing via trace 531d within the same routing layer.

Figure 5F:
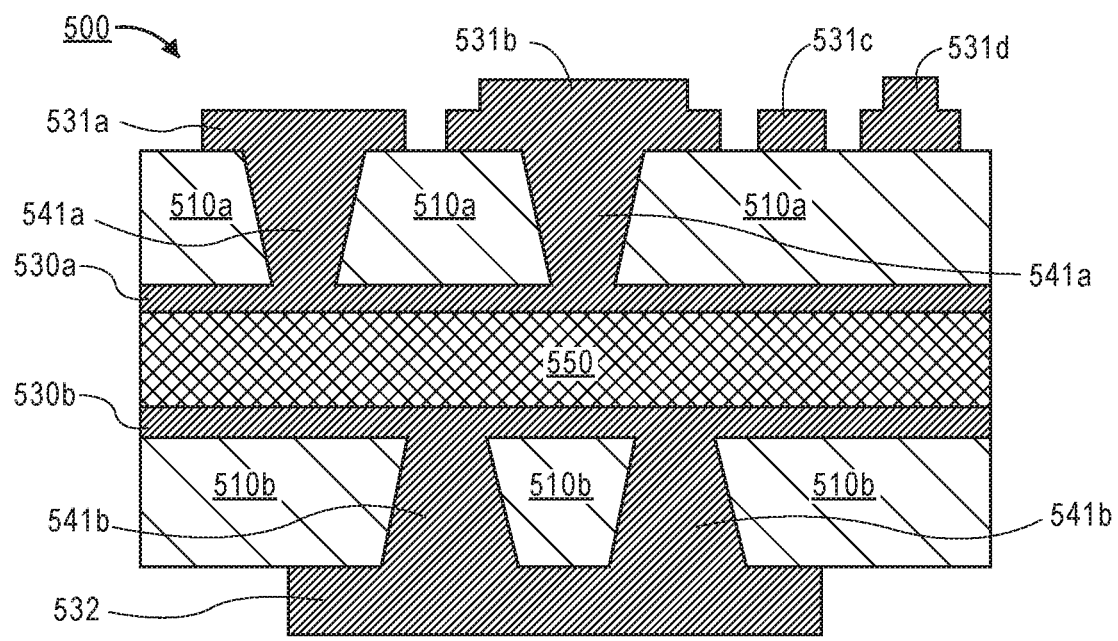
Figure 5G:
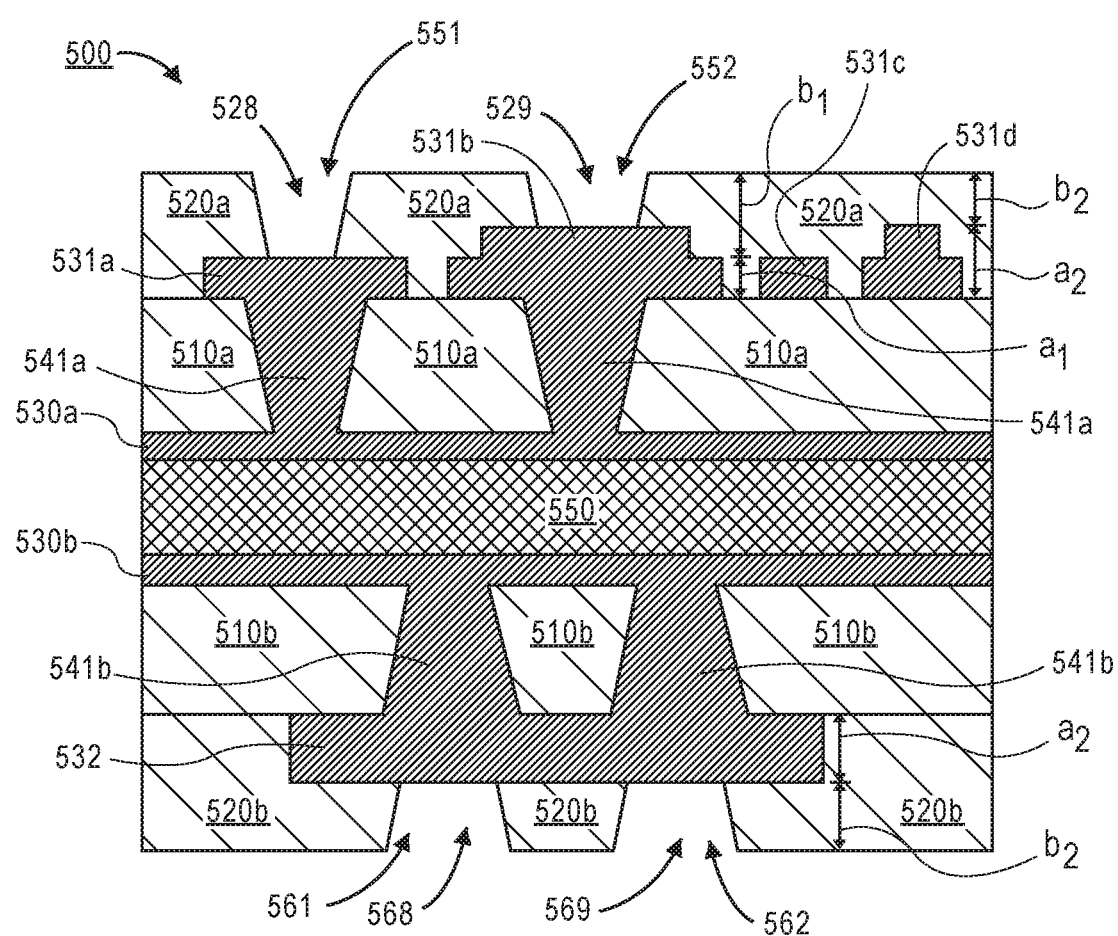

FIGS. 5F-5G illustrates removing the second photoresist layer 542 and the first photoresist layer 540b, and disposing a second dielectric layer 520a over the second conductive layer 531 and the first dielectric layer 510a, and a second dielectric layer 520b over the third conductive layer 532 and the first dielectric layer 510b. For one embodiment, after the second photoresist layer 542 and the first photoresist layer 540b are removed, the process flow may include a fast etching process (or the like) prior to disposing the second dielectric layers 520a-b. For one embodiment, the second dielectric layers 520a-b may be a BF layer. In an embodiment, the second dielectric layers 520a-b are formed to have a thickness that may completely cover the top surfaces, respectively, of the second and third conductive layers 531-532, where the second dielectric layers 520a-b have a first dielectric thickness $b_1$ that is greater than a second dielectric thickness $b_2$. For one embodiment, the first dielectric thickness $b_1$ formed above the trace 531c enables thicker electrical insulation for the thin first trace 531c, which helps mitigate noise and crosstalk.

As shown in FIG. 5G, the second dielectric layer 520a may be patterned to form a via opening 528 (or a third top via opening) to expose the via pad 531a, and a via opening 529 (or a fourth top via opening) to expose the via pad 531b. For one embodiment, a thickness of the via opening 528 (e.g., a thickness of approximately 40 µm or less) is greater than a thickness of the via opening 529 (e.g., a thickness of approximately 30 µm or less). Additionally, the second dielectric layer 520b may be patterned to form a via opening 568 (or a third bottom via opening) to expose the third conductive layer 532, and a via opening 569 (or a fourth bottom via opening) to expose the third conductive layer 532. For one embodiment, a thickness of the via opening 568 may be approximately equal to a thickness of the via opening 569 (e.g., thicknesses of approximately 30 µm or less).

According to additional embodiments, the via openings 528-529 may be used to form a third top via 551 and a fourth top via 552, respectively, with different thicknesses, where the third and fourth vias 551-552 may be formed using a third deposition process as the third and fourth vias 551-552 may have higher tapered shapes (e.g., approximately greater than 90 degree tapers) and curved Cu grain boundaries. Likewise, in these additional embodiments, the via openings 568-569 may be used to form a third bottom via 561 and a fourth bottom via 562, respectively, with same thicknesses (or different thicknesses if desired), where the third and fourth bottom vias 561-562 may also be formed using the third deposition process described above.

In one embodiment, the third and fourth top vias 551-552 and the third and fourth bottom vias 561-562 may be formed as laser vias (e.g., as compared to litho-defined/plated vias). For one embodiment, these subsequent vias 551-552 and 561-562 may be formed using similar steps as described in FIGS. 5B-5E. Moreover, the via openings 528-529 may be used to drill and plate these subsequent third and fourth vias 551-552, where a thickness of the third via 551 may be greater than a thickness of the fourth via 552, and where the third and fourth vias 552-552 may be disposed on two or more Cu features with different thicknesses, such as the via pad 531*a* and the via pad 531*b* respectively, within the same routing layer. Note that the steps shown in FIGS. 5A-5G may be repeated to form an additional routing layer above the second dielectric layers 520*a-b*, where the additional routing layer may also have conductive features/structures with different trace and dielectric thicknesses (as described herein).

In some embodiments, as shown in FIG. 5G, the package substrate 500 may include a first conductive layer 531 in a first dielectric 520; a first trace 531*c* of the first conductive layer 531 having a first thickness $a_1$; and a second trace 531*d* of the first conductive layer 531 having a second thickness (i.e., $a_1$) and a third thickness $a_2$, where the third thickness $a_2$ of the second trace 531*d* is greater than the first thickness $a_1$ of the first trace 531*c*, and where the second thickness of the second trace is approximately equal to the first thickness $a_1$ of the first trace 531*c*. The package substrate 500 may also include a first via pad 531*a* of the first conductive layer 531 having the first thickness $a_1$; and a second via pad 531*b* of the conductive layer 531 having the second thickness and the third thickness $a_2$, where the third thickness of the second via pad 531*b* is greater than the first thickness of the first via pad 531*a*, and where the second thickness of the second via pad 531*b* is approximately equal to the first thickness $a_1$ of the first via pad 531*a*.

For additional embodiments, the package substrate 500 may further include a second conductive layer 530*a* on a top surface of a substrate 550; a second dielectric 510*a* on the second conductive layer 530*a*, where the first dielectric 520*a* is disposed on the second dielectric 510*a*, where the substrate 550 is at least one of a core substrate and a coreless substrate, and where the first conductive layer 531 is disposed on the second dielectric 510*a*; and first vias 541*a* disposed in the second dielectric 510*a*, where the first vias 541*a* couple the second conductive layer 530*a* to the first and second via pads 531*a-b* of the first conductive layer 531.

For additional embodiments, the package substrate 500 may further include a third via 551 having a third thickness disposed on the first via pad 531*a*, where the third via 551 is disposed in the first dielectric 520*a*; and a fourth via 552 having a fourth thickness disposed on the second via pad 531*b*, where the fourth via 552 is disposed in the first dielectric 520*a*, where the third thickness is greater than the fourth thickness, where the third and fourth vias 551-552 are laser vias, and where a bottom surface of the fourth via is above a bottom surface of the third via.

For additional embodiments, the package substrate 500 may further include a third conductive layer 532 in a third dielectric 520*b*; a third via pad 532 of the third conductive layer having a fifth thickness, where the fifth thickness of the third via pad 532 is greater than the first thickness of the first trace 531*c* and the first via pad 531*a* of the first conductive layer 531, and where the fifth thickness of the third via pad 532 is approximately equal to the third thickness of the second trace 531*d* and the second via pad 531*b* of the first conductive layer 531; a fourth conductive layer 530*b* on a bottom surface of the substrate 550; a fourth dielectric 510 on the fourth conductive layer 530*b*, where the third dielectric 520*b* is disposed on the fourth dielectric 510*b*, and where the third conductive layer 532 is disposed on the fourth dielectric 510*b*; and second vias 541*b* disposed in the fourth dielectric 510*b*, where the second vias 541*b* couple the fourth conductive layer 530*b* to the third via pad 532 of the third conductive layer.

Note that the package substrate 500 as shown with the process flow of FIGS. 5A-5G may include fewer or additional packaging components and steps based on the desired packaging design.

FIGS. 6A-6G are illustrations of cross-sectional views of a process flow to form a package substrate 600 having vias 641*a-b*, traces 631*c-d*, conductive layers 630-632, and dielectric layers 610*a-b* and 620*a-b* on a substrate 650, where a dielectric layer 620*a* include via pads 631*a-b*, traces 631*c-d*, and dielectric portions $b_1$ and $b_2$ with different thicknesses, and a dielectric layer 620*b* include via pads 632*a-b*, traces 632*c-d*, and dielectric portions $b_1$ and $b_2$ with different thicknesses, according to some embodiments.

These embodiments as shown with respect to FIGS. 6A-6G provide the process flow that combines a lithographic plating and patterning process and a laser/drilling via process to form two or more sets of conductive features/structures (e.g., traces, vias, via pads, planes, etc.) having different desired thicknesses. The process flow illustrated with FIGS. 6A-6G uses two individual exposures steps with two different photoresists—where a first photoresist having a front-side photoresist layer and a back-side photoresist layer that may be patterned as symmetric photoresist layers (i.e., the front-side photoresist layer may have a thickness that is approximately equal to a thickness of the back-side photoresist layer)—to pattern these two sets of conductive features, each set having a desired Cu thickness and a desired dielectric thickness to provide the electrical insulation needed by the desired Cu thickness. These embodiments of the package substrate 600 may utilize thinner photoresists (e.g., first photoresists 640*a-b*) to enable finer litho-defined conductive features, such as thinner traces, vias, and via pads that may be approximately 15 μm or less.

The process flow shown with FIGS. 6A-6G may improve impedance tolerances for HSIO interconnects by enabling thinner conductive features (e.g., traces 631*c* and 632*c*, and via pads 631*a* and 632*a*) with thick dielectric for single-ended routing structures and thicker conductive features (e.g., traces 631*d* and 632*d*, and via pads 631*b* and 632*b*) with thinner dielectric for differential routing structures to be manufactured into a single routing layer of the package substrate 600. For one embodiment, the package substrate 600 shown in FIGS. 6A-6G may be similar to the package substrate 100 of FIG. 1, but the package substrate 600 may include the substrate 650 having front and back sides (i.e., top and bottom surfaces) with symmetrical thinner and thicker conductive features, where the thicker conductive features may have a diameter (or width) that is greater than a diameter (or width) of the thinner conductive features. In these embodiments, the process flow shown with FIGS. 6A-6G may enable (i) disposing (or forming) finer/thinner features on the top and bottom surfaces of the substrate, (ii) matching thinner and thicker features on the top and bottom surfaces of the substrate, while forming thicker features above/on the thinner features of both surfaces of the substrate to ultimately form thicker features with offsetting thicknesses and diameters/widths (e.g., as shown with traces 631*d* and 632*d*, and via pads 631*b* and 632*b* of FIG. 6G), (iii) improved alignment of the litho-defined Cu features, and (iv) disposing finer/thinner features (e.g., of roughly 9/12 m towards 2/2 μm or less) to increase space and routing density (i.e., allow for optimal routing density).

One such embodiment is illustrated and described based on FIGS. 6A-6G, which illustrates cross-sectional views of a package substrate 600 having a conductive layer with varying/different trace and dielectric thicknesses. For some embodiments, the conductive layers 630-632 (including the vias, traces, and via pads), the dielectric layers 610a-b and 620a-b, and photoresist layers 640a-b and 642a-b of the package substrate 600 shown in FIGS. 6A-6G may be similar to the conductive layers 130-131 (including the vias, traces, and via pads), the dielectric layers 110 and 120, and photoresist layers 140 and 142 of the package substrate 100 of FIG. 1A (e.g., the components of the package substrate 600 shown in FIGS. 6A-6G may be formed using the same or similar processes (and/or materials) as the package substrate 100 of FIG. 1A). In the illustrated embodiments, the patterning and plating of the build-up layers in the package substrate 600 is shown, however it is to be appreciated that the illustrated features are not limiting and may be formed using different processing operations. Note that well-known features of FIGS. 6A-6G are omitted or simplified in order not to obscure the illustrative implementations.

Figure 6A:
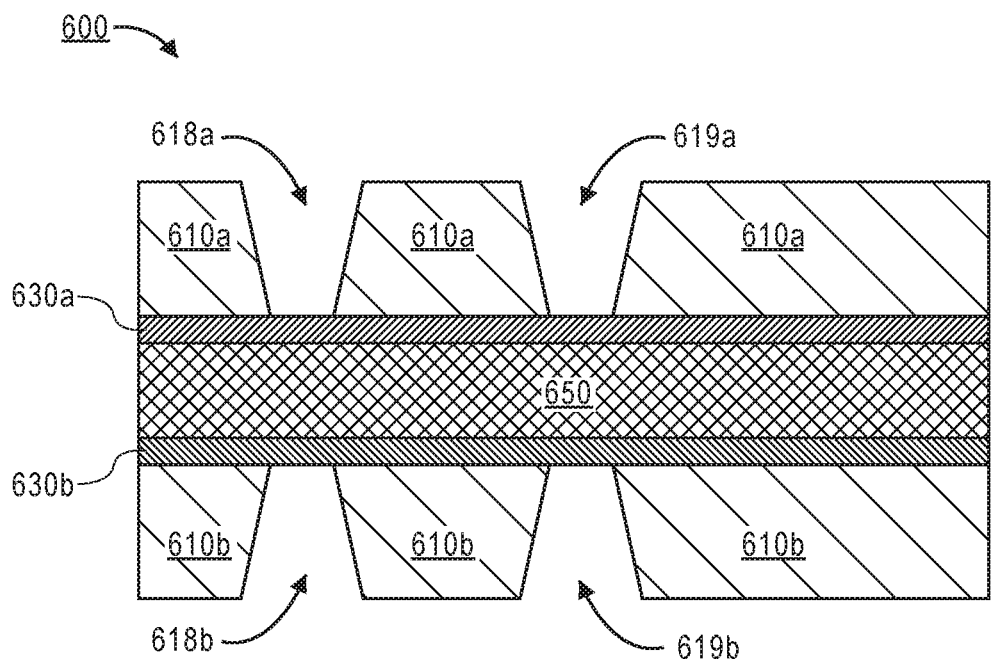
FIGS. 6A-6G are illustrations of cross-sectional views of a process flow to form a package substrate having vias, traces, conductive layers, and dielectric layers on a substrate, where a dielectric layer includes traces and dielectric portions with different thicknesses, according to some embodiments.

FIG. 6A illustrates the package substrate 600 including a substrate 650, first conductive layers 630a-b, first dielectric layers 610a-b, and openings 618a and 619a (or first and second top openings) and 618b and 619b (or first and second bottom openings). The substrate 650 may include first conductive layers 630a-b, where the first conductive layers include 630a-b include a first top conductive layer 630a and a first bottom conductive layer 630b. In this embodiment, as shown in FIGS. 6A-6G, the substrate 650 may be a coreless substrate (or the like). The first top conductive layer 630a may be disposed on a top surface of the substrate 650, and the first bottom conductive layer 630b may be disposed on a bottom surface of the substrate 650. Note that, as described herein, the process flow shown in FIGS. 6A-6G may be implemented symmetrically on both front/back sides of the substrate approximately at the same time.

The package substrate 600 also include first dielectric layers 610a-b, openings 618a and 619a (or top openings), and openings 618b and 619b (or bottom openings). The first dielectric layers 610a-b may be disposed on/above the first conductive layers 630a-b, respectively. In one embodiment, the first dielectric layer 610a is patterned to form the openings 618a and 619a that expose surface portions of the first top conductive layer 630a. Likewise, in one embodiment, the first dielectric layer 610b is patterned to form the openings 618b and 619b that expose surface portions of the first bottom conductive layer 630b. For one embodiment, each of the via openings 618a-b and 619a-b may have approximately the same width and thickness. For another embodiment, one or more of the via openings 618a-b and 619a-b may have a different width/thickness than a width/thickness of the other via openings 618a-b and 619a-b.

Figure 6B:
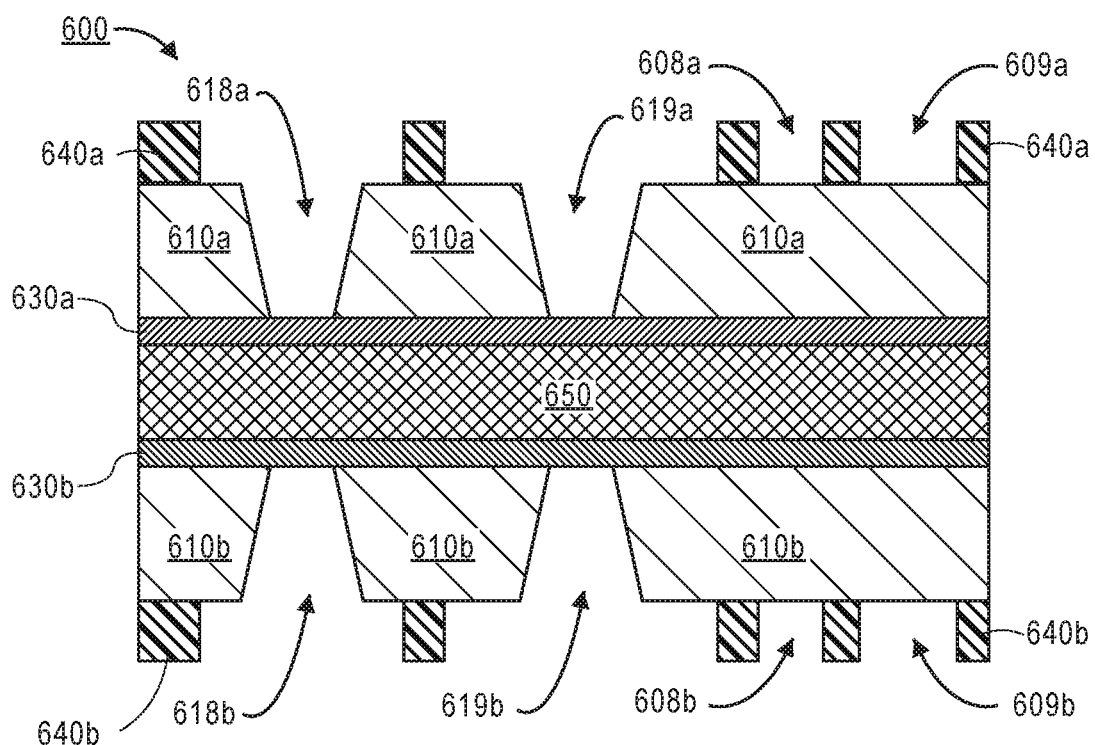

FIG. 6B illustrates disposing and patterning (i) a first photoresist layer 640a to form via openings 618a and 619a and trace openings 608a and 609a on the first dielectric layer 610a, and (ii) a first photoresist layer 640b to form via openings 618b and 619b and trace openings 608b and 609b on the first dielectric layer 610b. For one embodiment, the first photoresist layers 640a may be a DFR having a thickness of approximately 25 µm or less, which enables thinner litho-defined conductive features (e.g., traces 631c and via pad 631a of FIG. 6G). For another embodiment, the first photoresist layer 640b may be a DFR having a thickness of approximately 25 µm or less, which enables thinner litho-defined conductive features (e.g., trace 632c and via pad 632a of FIG. 6G).

In one embodiment, the first top openings of the first photo resist layer 640a include via openings 618a and 619a through the first photoresist layer 640a and the first dielectric layer 610a, and trace openings 608a and 609a through the first photoresist layer 640a. In one embodiment, the first bottom openings of the first photo resist layer 640b include via openings 618b and 619b through the first photoresist layer 640b and the first dielectric layer 610b, and trace openings 608b and 609b through the first photoresist layer 640b. According to one embodiment, the first photoresist layers 640a-b may be formed over the first dielectric layers 610a-b and patterned to provide openings for the formation of one or more thinner traces, via pads, and layers/planes (e.g., traces 631c and 632c, and via pads 631a and 632a of FIG. 6C).

Figure 6C:
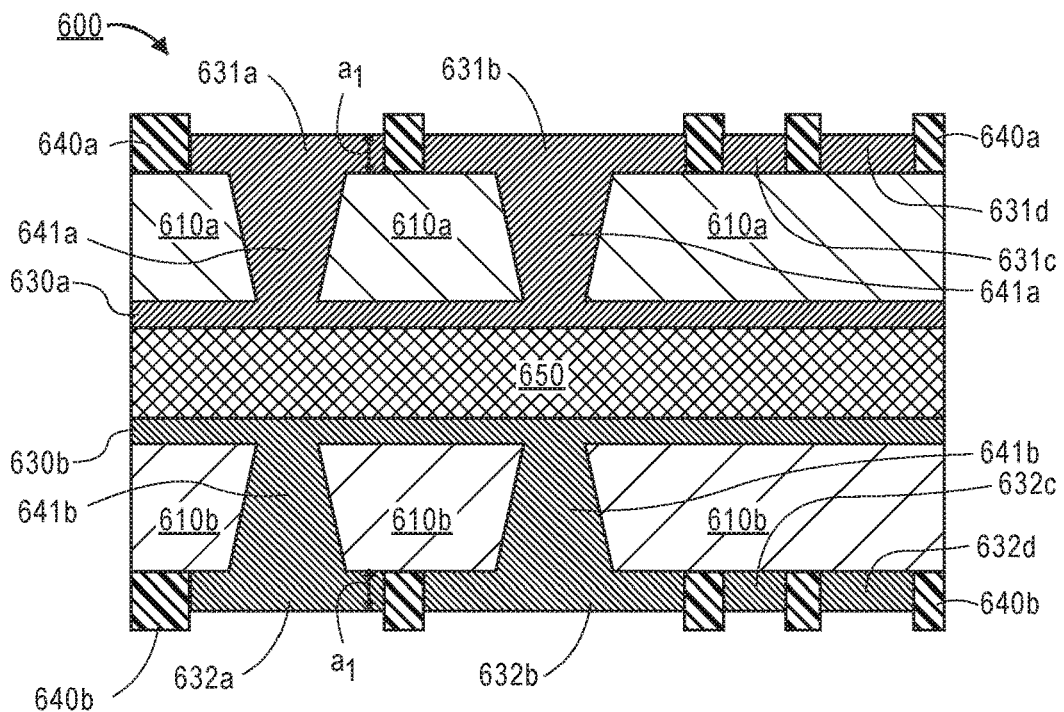

FIG. 6C illustrates the process flow depositing a conductive material into the first top openings to form top vias 641a on the first top conductive layer 630a, via pads 631a-b on the top vias 641a, and traces 631c-d on the first dielectric layer 610a. The process flow also illustrates depositing the conductive material into the first bottom openings to form bottom vias 641b on the first bottom conductive layer 630b, via pads 632a-b on the bottom vias 641b, and traces 632c-d on the first dielectric layer 610b. For one embodiment, a second conductive layer 631 is disposed above the first dielectric layer 610a, the top vias 641a, and the first conductive layer 630a, where the second conductive layer 631 may include the via pads 631a-b and the traces 631c-d. In an embodiment, a third conductive layer 632 is disposed above the first dielectric layer 610b, the bottom vias 641b, and the first conductive layer 630b, where the third conductive layer 632 may include the via pads 632a-b and the traces 632c-d.

For one embodiment, each of the conductive features of the second and third conductive layers 631-632 are formed to initially have a first thickness $a_1$. For one embodiment, the first thickness $a_1$ of each of the conductive features of the second and third conductive layers 631-632 may be approximately 15 µm or less. According to one embodiment, the first patterning and plating process (as shown with FIGS. 6B-6C) provides, for example, thinner traces 631c and 632c and thinner via pads 631a and 632a which may have thicker electrical insulations, including narrow trace widths for traces 631c and 632c, wide trace spacings for traces 631c and 632c, and thicker dielectric portions above and below the traces 631c and 632c (as shown below in FIG. 6G). For example, the traces 631c and 632c may be used for single-ended routing.

Figure 6D:
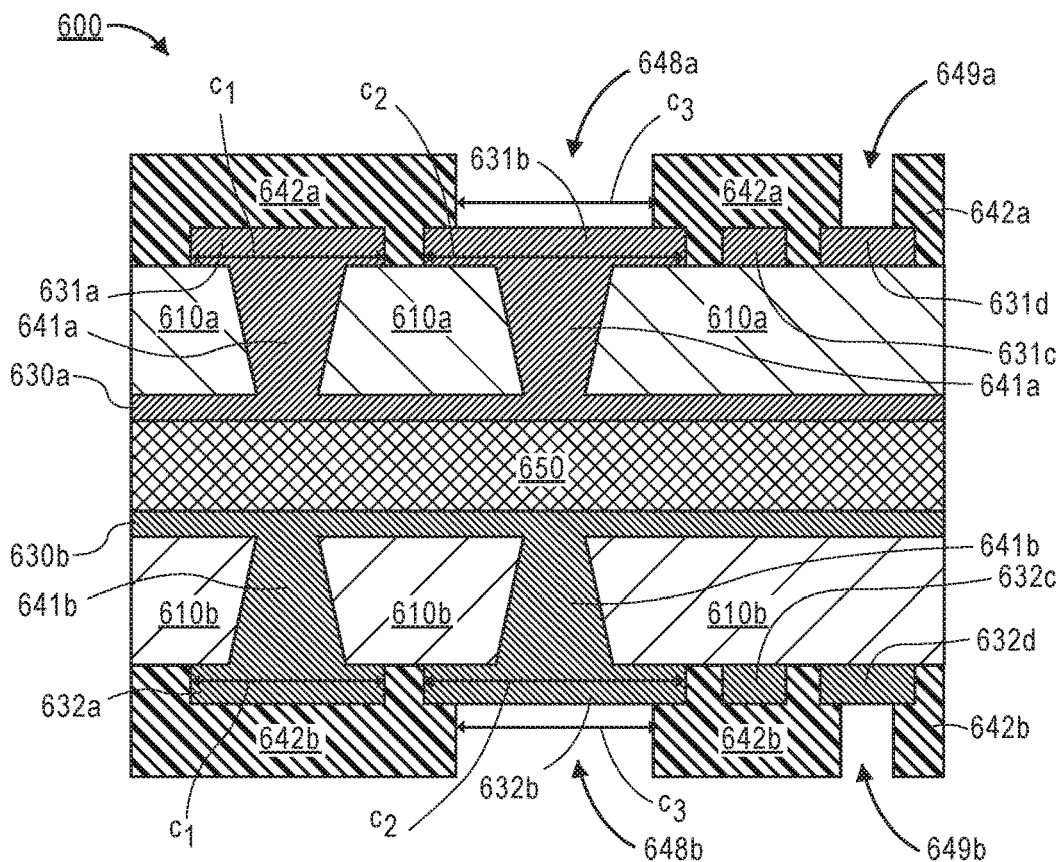

FIG. 6D illustrates disposing a second photoresist layer 642a-b over the second and third conductive layers 631-632 and the first photoresist layers 640a-b, respectively. For one embodiment, the second photoresist layer 642a is disposed and patterned to form openings 648a and 649a (or top offsetting openings) respectively above the via pad 631b and the trace 631d. For one embodiment, the second photoresist layer 642a may be a DFR having a thickness of approximately 35 µm or less, which enables thicker litho-defined conductive features (e.g., trace 631d and via pad 631b of FIG. 6G). As such, the second photoresist layer 642a may have a thickness that is greater than a thickness of the first photoresist layer 640a.

Additionally, in these embodiments, the second photoresist layer 642b is disposed and patterned to form openings 648b and 649b (or bottom offsetting openings) respectively above the via pad 632b and the trace 632d. For one embodiment, the second photoresist layer 642b may be a DFR having a thickness of approximately 35 µm or less, which enables thicker litho-defined conductive features (e.g., trace 632d and via pad 632b of FIG. 6G). Likewise, the second photoresist layer 642b may have a thickness that is greater than a thickness of the first photoresist layer 640b. Note that the second photoresist layers 642a-b may be formed as a combination of the first photoresist layer 640a-b and the second photoresist layer 642a-b.

In one embodiment, the openings of the second photoresist layer 642a include a via pad opening 648a formed above a top surface portion of the via pad 631b, and a trace opening 649a formed above a top surface portion of the trace 631d. For one embodiment, the via pad 631a may have a diameter (or width) of approximately 77 μm or less, and the via pad 631b may have a diameter of approximately 93 μm or less. In some embodiments, for power delivery requirements, the via opening 648a may have a diameter (or width) of approximately 77 μm or less (i.e., the exposed top surface portion of the trace 631d may have a diameter of approximately 77 μm or less) to be approximately equal to the diameter of the via pad 631a. For example, the second photoresist layer 642a may be patterned to form the opening 648a with an alignment (or offset) of approximately 8 μm or less from the outer edge(s) of the via pad 631b to the inner wall(s) of the opening 648a.

For one embodiment, the openings of the second photoresist layer 642b include a via pad opening 648b formed above a top surface portion of the via pad 632b, and a trace opening 649b formed above a top surface portion of the trace 632d. For one embodiment, the via pad 632a may have a diameter (or width) of approximately 77 μm or less, and the via pad 632b may have a diameter of approximately 93 μm or less. In some embodiments, for power delivery requirements, the via opening 648b may have a diameter (or width) of approximately 77 μm or less (i.e., the exposed top surface portion of the trace 632d may have a diameter of approximately 77 μm or less) to be approximately equal to the diameter of the via pad 632a. For example, the second photoresist layer 642b may be patterned to form the opening 648b with an alignment (or offset) of approximately 8 μm or less from the outer edge(s) of the via pad 632b to the inner wall(s) of the opening 648b.

Figure 6E:
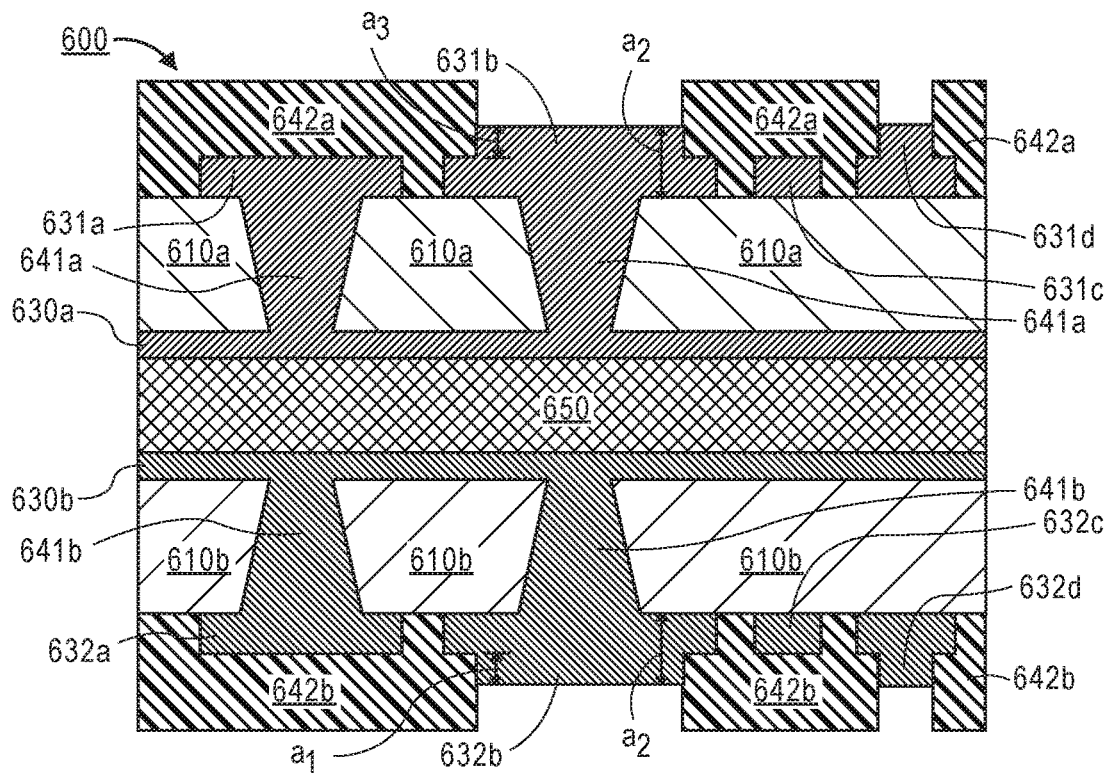

FIG. 6E illustrates the process flow depositing a conductive material into the openings 648a and 649a (as shown in FIG. 6D) to respectively (and ultimately) form a via pad 631b (or an offsetting-shaped via pad) on one of the top vias 641a, and a trace 631d (or an offsetting-shaped trace) on the first dielectric layer 610a (i.e., this step may be referred to as a second metal deposition process). The process flow also illustrates depositing the conductive material into the openings 648b and 649b (as shown in FIG. 6D) to respectively (and ultimately) form a via pad 632b (or an offsetting-shaped via pad) on one of the top vias 641b, and a trace 632d (or an offsetting-shaped trace) on the first dielectric layer 610b.

As illustrated, for one embodiment, the via pads 631b and 632b and the traces 631d and 632d are formed to have a second thickness $a_2$ that is different than the first thickness $a_1$, as the via pads 631a and 632b and the traces 631c and 632c are protected from further metal deposition by the second photoresist layers 642a-b. Also note, as illustrated in these embodiments, each of the via pads 631b and 632b and the traces 631d and 632d are formed to have two different thicknesses, which include a first thickness $a_1$ for the outer edges of the first metal pad/trace deposition, and a second thickness $a_2$ for the combined thicknesses of the first thickness $a_1$ and a third thickness $a_3$ of the second metal pad/trace deposition (i.e., $a_2=a_1+a_3$).

For one embodiment, the second thickness $a_2$ of the via pads 631b and 632b and the traces 631d and 632d may be approximately 25 μm or less. For one embodiment, each of the via pads 631d and 632d may have two different diameters, which include a first diameters $c_2$ for the outer diameter of the first metal pad deposition, and a second diameter $c_3$ for the inner diameter of the stacked second metal pad deposition (i.e., the first diameter $c_2$ is greater than the second diameter $c_3$). Additionally, in some embodiments, each of the via pads 631a and 632a has a diameter $c_1$ that is approximately equal to the second diameter $c_3$ of each of the via pads 631b and 632b. According to one embodiment, the second patterning and plating process provides thicker traces 631d and 632d and thicker via pads 631b and 632b which may have thinner electrical insulations, including wide trace widths for traces 631d and 632d, narrow trace spacings for traces 631d and 632d, and thicker dielectric portions above and below the traces 631d and 632d (as shown below in FIG. 6G). For example, the traces 631d and 632d may be used for differential routing. Accordingly, in this illustrated routing layer of the package substrate 600, each of the traces 631d and 632d has the second thickness $a_2$ that is greater than the first thickness $a_1$ of each of the traces 631c and 632c, which enables single-ended routing via traces 631c and 632c and differential routing via traces 631d and 632d, respectively, within the same routing layers (i.e., the top routing layer and the bottom routing layer).

Figure 6F:
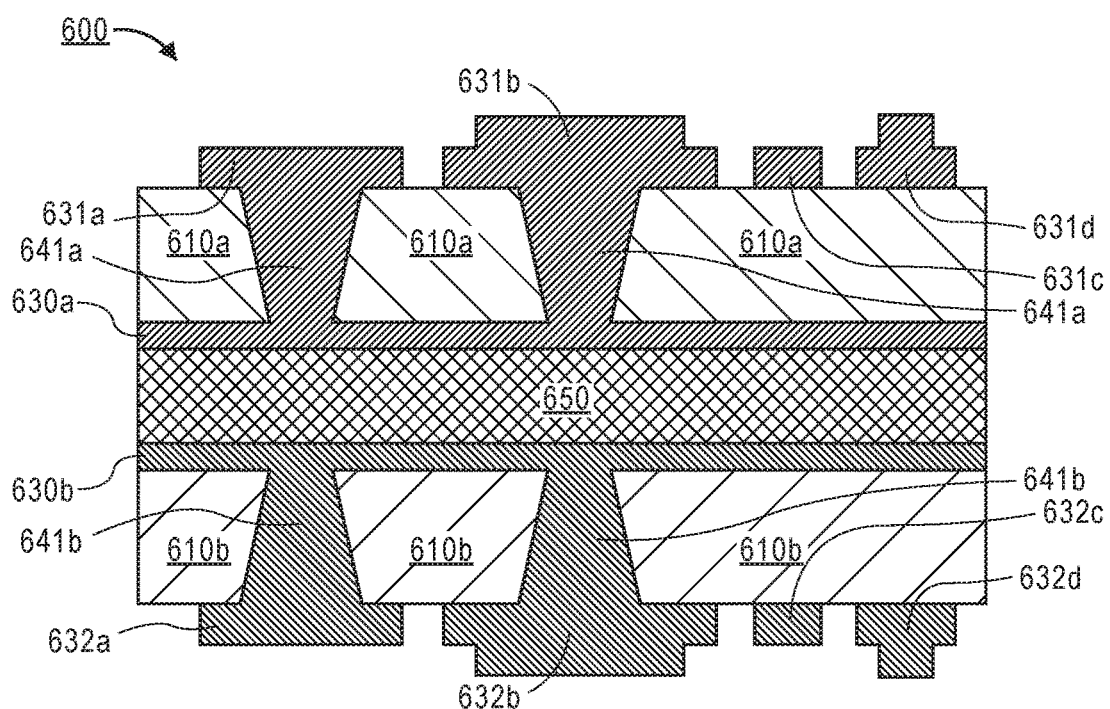
Figure 6G:
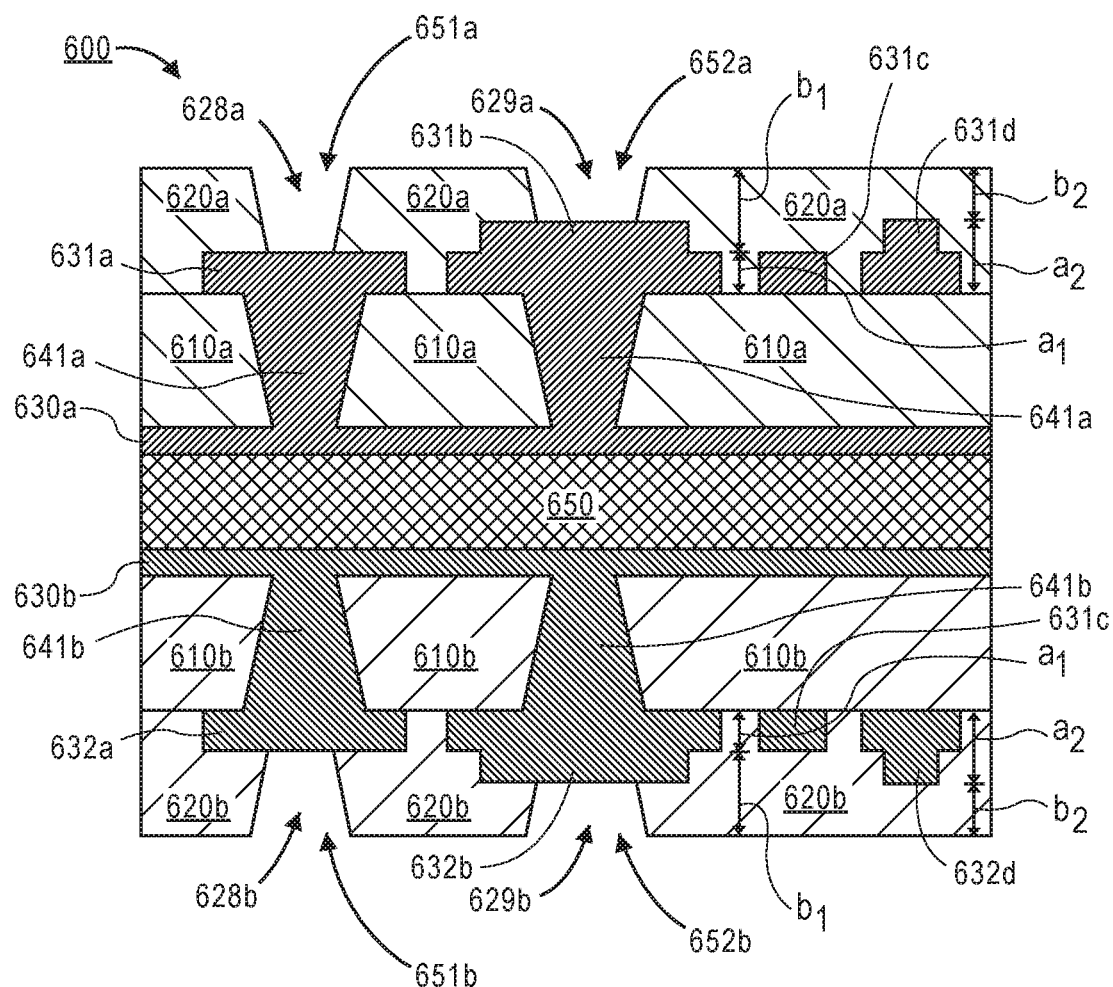

FIGS. 6F-6G illustrates removing the second photoresist layers 642a-b, and disposing a second dielectric layers 620a over the second conductive layer 631 and the first dielectric layer 610a, and a second dielectric layer 620b over the third conductive layer 632 and the first dielectric layer 610b. For one embodiment, after the second photoresist layers 642a-b are removed, the process flow may include a fast etching process (or the like) prior to disposing the second dielectric layers 620a-b. For one embodiment, the second dielectric layers 620a-b may be a BF layer. In an embodiment, the second dielectric layers 620a-b are formed to a thickness that may completely cover the top surfaces, respectively, of the second and third conductive layers 631-632, where the second dielectric layers 620a-b have a first dielectric thickness $b_1$ that is greater than a second dielectric thickness $b_2$. For one embodiment, the first dielectric thickness $b_1$ formed above the traces 631c and 632c enables thicker electrical insulation for the thin first traces 631c and 632c, which helps mitigate noise and crosstalk.

As shown in FIG. 6G, the second dielectric layer 620a may be patterned to form a via opening 628a (or a third top via opening) to expose the via pad 631a, and a via opening 629a (or a fourth top via opening) to expose the via pad 631b. For one embodiment, a thickness of the via opening 628a (e.g., a thickness of approximately 40 μm or less) is greater than a thickness of the via opening 629 (e.g., a thickness of approximately 30 μm or less). Additionally, the second dielectric layer 620b may be patterned to form a via opening 628b (or a third bottom via opening) to expose the via pad 632a, and a via opening 629b (or a fourth bottom via opening) to expose the via pad 632b. For one embodiment, a thickness of the via opening 628b (e.g., a thickness of approximately 40 μm or less) is greater than a thickness of the via opening 629b (e.g., a thickness of approximately 30 μm or less).

According to additional embodiments, the via openings 628a-b and 629a-b may be used to form third vias 651a-b and fourth vias 652a-b, respectively, with different thicknesses, where the third and fourth vias 651a-b and 652a-b may be formed using a third deposition process as the third and fourth vias 651a-b and 652a-b may have higher tapered shapes (e.g., approximately greater than 90 degree tapers) and curved Cu grain boundaries.

In one embodiment, the third and fourth vias 651a-b and 652a-b may be formed as laser vias (e.g., as compared to litho-defined/plated vias). For one embodiment, these subsequent vias 651*a-b* and 652*a-b* may be formed using similar steps as described in FIGS. 6B-6E. Moreover, the via openings 628*a-b* and 629*a-b* may be used to drill and plate these subsequent third and fourth vias 651*a-b* and 652*a-b*, where a thickness of the third vias 651*a-b* may be greater than a thickness of the fourth vias 652*a-b*, and where the third and fourth vias 651*a-b* and 652*a-b* may be disposed on two or more Cu features with different thicknesses, such as the via pads 631*a* and 632*a* and the via pads 631*b* and 632*b*, respectively, within the same routing layer. Note that the steps shown in FIGS. 6A-6G may be repeated to form an additional routing layer above the second dielectric layers 620*a-b*, where the additional routing layer may also have conductive features/structures with different trace and dielectric thicknesses (as described herein).

Also note that the package substrate 600 as shown with the process flow of FIGS. 6A-6G may include fewer or additional packaging components and steps based on the desired packaging design.

Figure 7:
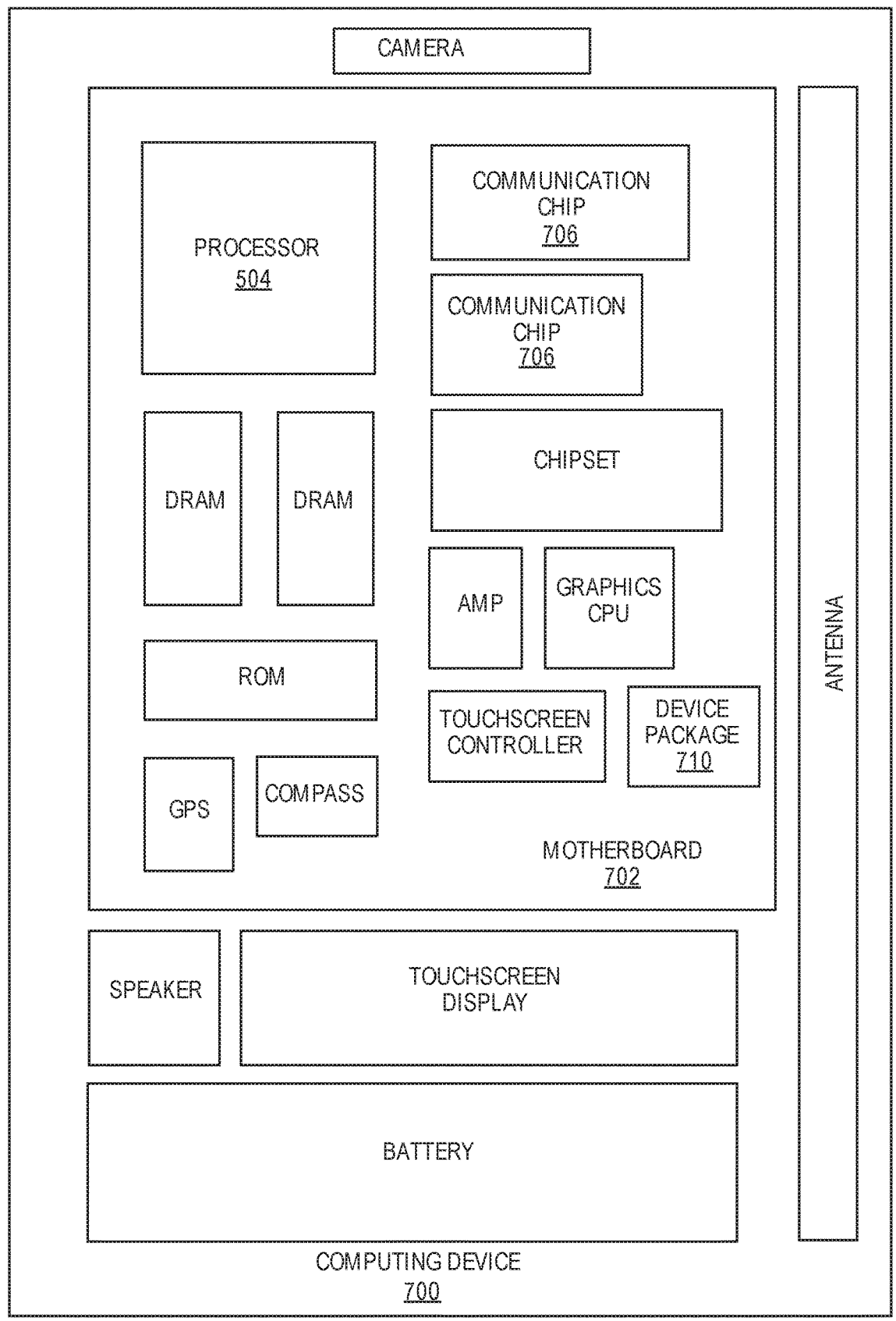
FIG. 7 is an illustration of a schematic block diagram illustrating a computer system that utilizes a package substrate having vias, traces, conductive layers, and dielectric layers, where a dielectric layer includes traces and dielectric portions with different thicknesses, according to one embodiment.

FIG. 7 is a schematic block diagram illustrating a computer system 700 that utilizes a package substrate having vias, traces, conductive layers, and dielectric layers, where a dielectric layer includes traces and dielectric portions with different thicknesses, according to one embodiment. FIG. 7 illustrates an example of computing device 700. Computing device 700 houses motherboard 702. For one embodiment, motherboard 702 may be similar to the substrates of FIGS. 1-3 and 5-6 (e.g., substrate 100 of FIGS. 1A-1B, 200 of FIGS. 2A-2F, 302 of FIG. 3, substrate 500 of FIG. 5A-5G, and substrate 600 of FIG. 6A-6G). Motherboard 702 may include a number of components, including but not limited to processor 704, device package 710 (or semiconductor package), and at least one communication chip 706. Processor 704 is physically and electrically coupled to motherboard 702. For some embodiments, at least one communication chip 706 is also physically and electrically coupled to motherboard 702. For other embodiments, at least one communication chip 706 is part of processor 704.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. Device package 710 may be, but is not limited to, a substrate, a packaging substrate, and/or a PCB. Device package 710 may include two or more different thicknesses for the traces, vias, via pads, and dielectric portions within a single routing layer (as illustrated in FIGS. 1-2 and 5-6)—or any other components from the figures described herein—of the computing device 700. Further, as described herein, the device package 710 has improved electrical performances by enabling thinner Cu features (e.g., traces, vias, planes, and/or via pads) with thick dielectric for single-ended routing structures and thicker Cu features with thinner dielectric for differential routing structures (e.g., as shown with the package substrate 100 of FIGS. 1A-1B, the package substrate 200 of FIGS. 2A-2F, the package substrate 500 of FIGS. 5A-5G, and the package substrate 600 of FIGS. 6A-6G)—without sacrificing/compromising the electrical requirements of either routing structure. The device package 710 thus provides two desired routing features into a single routing layer with less restrictions (e.g., as compared to existing solutions).

Note that device package 710 may be a single component/device, a subset of components, and/or an entire system, as the materials, features, and components may be limited to device package 710 and/or any other component of the computing device 700 that may need dual (or more) trace thicknesses within a single routing layer (e.g., the motherboard 702, the processor 704, and/or any other component of the computing device 700 may need a similar build-up structures as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 706 also includes an integrated circuit die packaged within the communication chip 706. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising of a conductive layer in a dielectric; a first trace of the conductive layer having a first thickness; and a second trace of the conductive layer having a second thickness. The second thickness of the second trace is greater than the first thickness of the first trace.

In example 2, the subject matter of example 1 can optionally include a first via pad of the conductive layer having the first thickness; and a second via pad of the conductive layer having the second thickness. The second thickness of the second via pad is greater than the first thickness of the first via pad.

In example 3, the subject matter of any of examples 1-2 can optionally include a first conductive layer in a first dielectric. The dielectric is disposed on the first dielectric. The conductive layer is disposed on the first dielectric; and vias in the first dielectric. The vias couple via pads of the first conductive layer to the first and second via pads of the conductive layer. In example 4, the subject matter of any of examples 1-3 can optionally include the dielectric which includes a first dielectric thickness and a second dielectric thickness. The first dielectric thickness is defined by a top surface of the first trace and a top surface of the dielectric. The second dielectric thickness is defined by a top surface of the second trace and the top surface of the dielectric.

In example 5, the subject matter of any of examples 1-4 can optionally include the second dielectric thickness is less than the first dielectric thickness.

In example 6, the subject matter of any of examples 1-5 can optionally include the top surface of the second trace is above the top surface of the first trace.

In example 7, the subject matter of any of examples 1-6 can optionally include a top surface of the second via pad is above a top surface of the first via pad.

In example 8, the subject matter of any of examples 1-7 can optionally include a third via having a third thickness disposed on the first via pad. The third via is disposed in the dielectric; and a fourth via having a fourth thickness disposed on the second via pad. The fourth via is disposed in the dielectric. The third thickness is greater than the fourth thickness. The third and fourth vias are laser vias, and wherein a bottom surface of the fourth via is above a bottom surface of the third via.

Example 9 is a package substrate comprising of a first conductive layer in a first dielectric; a first trace of the first conductive layer having a first thickness; and a second trace of the first conductive layer having a second thickness and a third thickness. The third thickness of the second trace is greater than the first thickness of the first trace. The second thickness of the second trace is approximately equal to the first thickness of the first trace.

In example 10, the subject matter of example 9 can optionally include a first via pad of the first conductive layer having the first thickness; and a second via pad of the conductive layer having the second thickness and the third thickness. The third thickness of the second via pad is greater than the first thickness of the first via pad. The second thickness of the second via pad is approximately equal to the first thickness of the first via pad.

In example 11, the subject matter of any of examples 9-10 can optionally include a second conductive layer on a top surface of a substrate; a second dielectric on the second conductive layer. The first dielectric is disposed on the second dielectric. The substrate is at least one of a core substrate and a coreless substrate. The first conductive layer is disposed on the second dielectric; and first vias in the second dielectric. The first vias couple the second conductive layer to the first and second via pads of the first conductive layer.

In example 12, the subject matter of any of examples 9-11 can optionally include the first dielectric which includes a first dielectric thickness and a second dielectric thickness. The first dielectric thickness is defined by a top surface of the first trace and a top surface of the first dielectric. The second dielectric thickness is defined by a top surface of the second trace and the top surface of the dielectric.

In example 13, the subject matter of any of examples 9-12 can optionally include the second dielectric thickness is less than the first dielectric thickness.

In example 14, the subject matter of any of examples 9-13 can optionally include the top surface of the second trace is above the top surface of the first trace. A top surface of the second via pad is above a top surface of the first via pad.

In example 15, the subject matter of any of examples 9-14 can optionally include a third via having a third thickness disposed on the first via pad. The third via is disposed in the first dielectric; and a fourth via having a fourth thickness disposed on the second via pad. The fourth via is disposed in the first dielectric. The third thickness is greater than the fourth thickness. The third and fourth vias are laser vias. A bottom surface of the fourth via is above a bottom surface of the third via.

In example 16, the subject matter of any of examples 9-15 can optionally include the second via pad having a first diameter and a second diameter. The first diameter is greater than the second diameter. The first via pad has a third diameter. The third diameter of the first via pad is approximately equal to the second diameter. Each of the second via pad and the second trace has an offsetting shape.

In example 17, the subject matter of any of examples 9-16 can optionally include a third conductive layer in a third dielectric; a third via pad of the third conductive layer having a fifth thickness. The fifth thickness of the third via pad is greater than the first thickness of the first trace and the first via pad of the first conductive layer. The fifth thickness of the third via pad is approximately equal to the third thickness of the second trace and the second via pad of the first conductive layer; a fourth conductive layer on a bottom surface of the substrate; a fourth dielectric on the fourth conductive layer. The third dielectric is disposed on the fourth dielectric. The third conductive layer is disposed on the fourth dielectric; and second vias in the fourth dielectric. The second vias couple the fourth conductive layer to the third via pad of the third conductive layer.

Example 18 is a method of forming a package substrate, comprising of disposing and patterning a first photoresist on a first dielectric to form first openings above a first conductive layer and the first dielectric. The first conductive layer is disposed in the first dielectric; disposing a conductive material into the first openings to form a first via, a first via pad, and a first trace. The first trace is disposed on the first dielectric. The first via couples the first via pad disposed above the first conductive layer. The first via pad and the first trace have a first thickness; removing the first photoresist on the first dielectric; disposing and patterning a second photoresist to form second openings above the first conductive layer and the first dielectric; disposing the conductive material into the second openings to form a second via, a second via pad, and a second trace. The second trace is disposed on the first dielectric. The second via couples the second via pad disposed above the first conductive layer. The second via pad and the second trace have a second thickness. The first via pad, the second via pad, the first trace, and the second trace form a second conductive layer; removing the second photoresist on the first conductive layer and the first dielectric; disposing a dielectric on the second conductive layer and the first dielectric. The second conductive layer is disposed on the first dielectric. The second thickness is greater than the first thickness; and patterning the dielectric to form a third via opening to expose the first via pad, and a fourth via opening to expose the second via pad. A thickness of the third via opening is greater than a thickness of the fourth via opening.

In example 19, the subject matter of example 18 can optionally include the dielectric which includes a first dielectric thickness and a second dielectric thickness. The first dielectric thickness is defined by a top surface of the first trace and a top surface of the dielectric. The second dielectric thickness is defined by a top surface of the second trace and the top surface of the dielectric.

In example 20, the subject matter of any of examples 18-19 can optionally include the second dielectric thickness is less than the first dielectric thickness.

In example 21, the subject matter of any of examples 18-20 can optionally include the top surface of the second trace is above the top surface of the first trace.

In example 22, the subject matter of any of examples 18-21 can optionally include a top surface of the second via pad is above a top surface of the first via pad.

In example 23, the subject matter of any of examples 18-22 can optionally include patterning the dielectric to form a third via opening to expose the first via pad, and a fourth via opening to expose the second via pad. A thickness of the third via opening is greater than a thickness of the fourth via opening; disposing the conductive material into the third via opening to form a third via having a third thickness. The third via is disposed on the first via pad, wherein the third via is disposed in the dielectric; and disposing the conductive material into the fourth via opening to form a fourth via having a fourth thickness. The fourth via is disposed on the second via pad. The fourth via is disposed in the dielectric. The third thickness is greater than the fourth thickness.

In example 24, the subject matter of any of examples 18-23 can optionally include the third and fourth via openings are formed with a laser via process. The third and fourth vias are laser vias having tapered shapes.

In example 25, the subject matter of any of examples 18-24 can optionally include a bottom surface of the fourth via is above a bottom surface of the third via.

Example 26 is a semiconductor package, comprising of an interposer on a substrate; and a die on the interposer; and a routing layer on the substrate. The routing layer includes a conductive layer in a dielectric, a first trace of the conductive layer having a first thickness, and a second trace of the conductive layer having a second thickness. The second thickness of the second trace is greater than the first thickness of the first trace.

In example 27, the subject matter of example 26 can optionally include a first via pad of the conductive layer having the first thickness; and a second via pad of the conductive layer having the second thickness. The second thickness of the second via pad is greater than the first thickness of the first via pad.

In example 28, the subject matter of any of examples 26-27 can optionally include a first routing layer having a first conductive layer in a first dielectric. The routing layer is disposed on the first routing layer. The dielectric is disposed on the first dielectric. The conductive layer is disposed on the first dielectric; and vias in the first dielectric. The vias couple via pads of the first conductive layer to the first and second via pads of the conductive layer.

In example 29, the subject matter of any of examples 26-28 can optionally include the dielectric which includes a first dielectric thickness and a second dielectric thickness. The first dielectric thickness is defined by a top surface of the first trace and a top surface of the dielectric. The second dielectric thickness is defined by a top surface of the second trace and the top surface of the dielectric.

In example 30, the subject matter of any of examples 26-29 can optionally include the second dielectric thickness is less than the first dielectric thickness.

In example 31, the subject matter of any of examples 26-30 can optionally include a top surface of the second trace is above a top surface of the first trace.

In example 32, the subject matter of any of examples 26-31 can optionally include a top surface of the second via pad is above a top surface of the first via pad.

In example 33, the subject matter of any of examples 26-32 can optionally include a third via having a third thickness disposed on the first via pad. The third via is disposed in the dielectric; and a fourth via having a fourth thickness disposed on the second via pad. The fourth via is disposed in the dielectric. The third thickness is greater than the fourth thickness. The third and fourth vias are laser vias. A bottom surface of the fourth via is above a bottom surface of the third via.

In example 34, the subject matter of any of examples 26-33 can optionally include the routing layer which includes a single-ended signal trace and a differential signal trace. The single-ended signal trace is the first trace. The differential signal trace is the second trace.

In example 35, the subject matter of any of examples 26-34 can optionally include the routing layer includes a first conductive layer in a first dielectric; a first trace of the first conductive layer having a first thickness; and a second trace of the first conductive layer having a second thickness and a third thickness. The third thickness of the second trace is greater than the first thickness of the first trace. The second thickness of the second trace is approximately equal to the first thickness of the first trace.

In example 36, the subject matter of any of examples 26-35 can optionally include a first via pad of the first conductive layer having the first thickness; and a second via pad of the conductive layer having the second thickness and the third thickness. The third thickness of the second via pad is greater than the first thickness of the first via pad. The second thickness of the second trace is approximately equal to the first thickness of the first trace.

In example 37, the subject matter of any of examples 26-36 can optionally include a second conductive layer on a top surface of a substrate, the second conductive layer in a second dielectric. The first dielectric is disposed on the second dielectric. The substrate is at least one of a core substrate and a coreless substrate. The first conductive layer is disposed on the second dielectric; and first vias in the second dielectric. The first vias couple the second conductive layer to the first and second via pads of the first conductive layer.

In example 38, the subject matter of any of examples 26-37 can optionally include the first dielectric includes a first dielectric thickness and a second dielectric thickness. The first dielectric thickness is defined by a top surface of the first trace and a top surface of the first dielectric. The second dielectric thickness is defined by a top surface of the second trace and the top surface of the dielectric.

In example 39, the subject matter of any of examples 26-38 can optionally include the second dielectric thickness is less than the first dielectric thickness.

In example 40, the subject matter of any of examples 26-39 can optionally include the top surface of the second trace is above the top surface of the first trace. A top surface of the second via pad is above a top surface of the first via pad.

In example 41, the subject matter of any of examples 26-40 can optionally include a third via having a third thickness disposed on the first via pad. The third via is disposed in the first dielectric; and a fourth via having a fourth thickness disposed on the second via pad. The fourth via is disposed in the first dielectric. The third thickness is greater than the fourth thickness. The third and fourth vias are laser vias. A bottom surface of the fourth via is above a bottom surface of the third via.

In example 42, the subject matter of any of examples 26-41 can optionally include the second via pad has a first diameter and a second diameter. The first diameter is greater than the second diameter. The first via pad has a third diameter. The third diameter of the first via pad is approximately equal to the second diameter. Each of the second via pad and the second trace has an offsetting shape.

In example 43, the subject matter of any of examples 26-42 can optionally include a third conductive layer in a third dielectric; a third via pad of the third conductive layer having a fifth thickness. The fifth thickness of the third via pad is greater than the first thickness of the first trace and the first via pad of the first conductive layer. The fifth thickness of the third via pad is approximately equal to the third thickness of the second trace and the second via pad of the first conductive layer; a fourth conductive layer on a bottom surface of the substrate, the fourth conductive layer in a fourth dielectric. The third dielectric is disposed on the fourth dielectric. The third conductive layer is disposed on the fourth dielectric; and second vias in the fourth dielectric. The second vias couple the fourth conductive layer to the third via pad of the third conductive layer.

Example 44 is a method of forming a package substrate, comprising of disposing and patterning a first photoresist on a second dielectric to form first openings above a second conductive layer. The second conductive layer is disposed on a top surface of a substrate. The second dielectric is on the second conductive layer disposing a conductive material into the first openings to form a first via, a second via, a first via pad, a first portion, a first trace, and a second portion. The first trace is disposed on the second dielectric and the first via. The first portion is disposed on the second dielectric and the second via. The first via couples the first via pad to the second conductive layer. The first via pad and the first trace have a first thickness; disposing a second photoresist on the first photoresist and patterning the second photoresist to form second openings above the first portion and the second portion; disposing the conductive material into the second openings above the first portion and the second portion to respectively form a second via pad and a second trace. The second trace is disposed on the second dielectric. The second via couples the second via pad to the second conductive layer. The second via pad and the second trace have a second thickness and a third thickness. The third thickness of the second via pad and the second trace is greater than the first thickness of the first via pad and the first trace. The second thickness of the second via pad and the second trace is approximately equal to the first thickness of the first via pad and the first trace. The first via pad, the second via pad, the first trace, and the second trace form a first conductive layer; removing the second and first photoresists; disposing a first dielectric on the second conductive layer and the second dielectric. The second conductive layer is disposed on the first dielectric; and patterning the dielectric to form a third via opening to expose the first via pad, and a fourth via opening to expose the second via pad. A thickness of the third via opening is greater than a thickness of the fourth via opening.

In example 45, the subject matter of example 44 can optionally include the substrate is at least one of a core substrate and a coreless substrate.

In example 46, the subject matter of any of examples 44-45 can optionally include the first dielectric which includes a first dielectric thickness and a second dielectric thickness. The first dielectric thickness is defined by a top surface of the first trace and a top surface of the first dielectric. The second dielectric thickness is defined by a top surface of the second trace and the top surface of the dielectric.

In example 47, the subject matter of any of examples 44-46 can optionally include the second dielectric thickness is less than the first dielectric thickness.

In example 48, the subject matter of any of examples 44-47 can optionally include the top surface of the second trace is above the top surface of the first trace. A top surface of the second via pad is above a top surface of the first via pad.

In example 49, the subject matter of any of examples 44-48 can optionally include disposing a third via having a third thickness disposed on the first via pad. The third via is disposed in the first dielectric; and disposing a fourth via having a fourth thickness disposed on the second via pad. The fourth via is disposed in the first dielectric. The third thickness is greater than the fourth thickness. The third and fourth vias are laser vias. A bottom surface of the fourth via is above a bottom surface of the third via.

In example 50, the subject matter of any of examples 44-49 can optionally include the second via pad having a first diameter and a second diameter. The first diameter is greater than the second diameter. The first via pad has a third diameter. The third diameter of the first via pad is approximately equal to the second diameter. Each of the second via pad and the second trace has an offsetting shape.

In example 51, the subject matter of any of examples 44-50 can optionally include disposing a third conductive layer in a third dielectric; disposing a third via pad of the third conductive layer having a fifth thickness. The fifth thickness of the third via pad is greater than the first thickness of the first trace and the first via pad of the first conductive layer. The fifth thickness of the third via pad is approximately equal to the third thickness of the second trace and the second via pad of the first conductive layer; disposing a fourth conductive layer on a bottom surface of the substrate; disposing a fourth dielectric on the fourth conductive layer. The third dielectric is disposed on the fourth dielectric. The third conductive layer is disposed on the fourth dielectric; and disposing second vias in the fourth dielectric. The second vias couple the fourth conductive layer to the third via pad of the third conductive layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
a conductive layer in a dielectric;
a first trace and a first via pad of the conductive layer having a first thickness, the first via pad having an uppermost surface;
a second trace and a second via pad of the conductive layer having a second thickness, wherein the second thickness of the second trace and the second via pad is greater than the first thickness of the first trace and the first via pad, and the second via pad having an uppermost surface above the uppermost surface of the first via pad, and wherein the dielectric includes a first via opening exposing the uppermost surface of the first via pad, and the dielectric includes a second via opening exposing the uppermost surface of the second via pad, the first via opening extending a depth in the dielectric greater than a depth of the second via opening.

2. The package substrate of claim 1, wherein the dielectric includes a first dielectric thickness and a second dielectric thickness.

3. The package substrate of claim 2, wherein the first dielectric thickness is defined by a top surface of the dielectric and top surfaces of the first trace and the first via pad, and wherein the second dielectric thickness is defined by the top surface of the dielectric and top surfaces of the second trace and the second via pad.

4. The package substrate of claim 3, wherein the second dielectric thickness is less than the first dielectric thickness.

5. The package substrate of claim 3, wherein the top surface of the second trace is above the top surface of the first trace.

6. The package substrate of claim 3, wherein the top surface of the second via pad is above the top surface of the first via pad.

7. The package substrate of claim 1, further comprising:
a first conductive layer in a first dielectric, wherein the dielectric is disposed on the first dielectric, and wherein the conductive layer is disposed on the first dielectric; and
vias and via pads of the first conductive layer in the first dielectric, wherein the vias couple the via pads of the first conductive layer to the first and second via pads of the conductive layer.

8. The package substrate of claim 7, further comprising:
a third via having a third thickness disposed on the first via pad having the first thickness, wherein the third via is disposed in the dielectric; and
a fourth via having a fourth thickness disposed on the second via pad having the second thickness, wherein the fourth via is disposed in the dielectric, wherein the third thickness is greater than the fourth thickness, wherein the third and fourth vias are tapered vias, wherein a bottom surface of the fourth via is above a bottom surface of the third via, and wherein the fourth thickness of the fourth via in the dielectric is less than a thickness of the vias in the first dielectric.

* * * * *